US011108006B2

(12) United States Patent
Kim et al.

(10) Patent No.: US 11,108,006 B2
(45) Date of Patent: Aug. 31, 2021

(54) DISPLAY APPARATUS AND MANUFACTURING METHOD OF THE SAME

(71) Applicant: Samsung Display Co., Ltd., Yongin-si (KR)

(72) Inventors: Jintaek Kim, Yongin-si (KR); Kiwan Ahn, Yongin-si (KR); Jinwoo Lee, Yongin-si (KR); Donghyun Kim, Yongin-si (KR); Pilsuk Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/220,033

(22) Filed: Dec. 14, 2018

(65) Prior Publication Data
US 2019/0189941 A1    Jun. 20, 2019

(30) Foreign Application Priority Data

Dec. 14, 2017 (KR) .................. 10-2017-0172645

(51) Int. Cl.
*H01L 27/32* (2006.01)
*H01L 51/05* (2006.01)
(Continued)

(52) U.S. Cl.
CPC ...... *H01L 51/0537* (2013.01); *H01L 27/1214* (2013.01); *H01L 27/3248* (2013.01);
(Continued)

(58) Field of Classification Search
CPC ............. H01L 27/3258; H01L 29/4908; H01L 27/3262; H01L 2924/13069;
(Continued)

(56) References Cited

U.S. PATENT DOCUMENTS 8,598,589 B2    12/2013   Ma et al.
2011/0303921 A1*  12/2011   Shin ................... H01L 51/0023
                                                                257/71
(Continued)

FOREIGN PATENT DOCUMENTS

KR    1020060098255 A    9/2006
KR    1020120002759 A    1/2012
KR    1020130116030 A    10/2013

*Primary Examiner* — Bitew A Dinke
(74) *Attorney, Agent, or Firm* — Cantor Colburn LLP

(57) ABSTRACT

A display apparatus includes a plurality of pixels each including a substrate on which are disposed: an interlayer insulating layer; a driving thin film transistor in which a driving semiconductor layer and a driving gate electrode are each disposed between the substrate and the first interlayer insulating layer; a first capacitor in which a first electrode, a first dielectric pattern and a second electrode are sequentially stacked, the first electrode being connected to the driving gate electrode; and a plurality of contact plugs extended through a thickness of the interlayer insulating layer, with which the driving thin film transistor and the first capacitor are respectively connected to electrodes outside thereof. Lateral surfaces of the first dielectric pattern are covered by the interlayer insulating layer, and the first dielectric pattern within the first capacitor is disposed spaced apart from each of the contact plugs.

12 Claims, 14 Drawing Sheets

(51) Int. Cl.
  *H01L 27/12* (2006.01)
  *H01L 51/56* (2006.01)
  *H01L 51/52* (2006.01)

(52) U.S. Cl.
  CPC ...... *H01L 27/3262* (2013.01); *H01L 27/3265* (2013.01); *H01L 27/3276* (2013.01); *H01L 51/56* (2013.01); *H01L 27/3246* (2013.01); *H01L 51/5218* (2013.01); *H01L 51/5234* (2013.01)

(58) Field of Classification Search
  CPC ............. H01L 51/0537; H01L 27/3276; H01L 27/3265; H01L 51/56; H01L 27/3248; H01L 27/1214; H01L 27/3246; H01L 51/5234; H01L 51/5218; H01L 27/12
  See application file for complete search history.

(56) References Cited

U.S. PATENT DOCUMENTS

| | | | |
|---|---|---|---|
| 2013/0119388 A1* | 5/2013 | Lee | H01L 51/5265 257/59 |
| 2013/0270619 A1 | 10/2013 | Schloesser et al. | |
| 2014/0117340 A1* | 5/2014 | Kim | H01L 27/1255 257/40 |
| 2014/0225075 A1* | 8/2014 | Zhan | H01L 29/78672 257/40 |
| 2014/0292622 A1* | 10/2014 | Lee | G09G 3/3233 345/80 |
| 2015/0001483 A1* | 1/2015 | Namkung | H01L 27/3244 257/40 |
| 2016/0005804 A1* | 1/2016 | Oh | H01L 51/0562 257/72 |
| 2016/0035810 A1* | 2/2016 | Park | H01L 27/3276 257/40 |
| 2016/0064462 A1* | 3/2016 | Yoon | H01L 27/1255 257/40 |
| 2016/0087021 A1* | 3/2016 | Sato | H01L 27/3262 257/43 |
| 2016/0111482 A1* | 4/2016 | Cho | H01L 27/3258 257/40 |
| 2016/0126262 A1* | 5/2016 | Tae | H01L 27/1255 257/71 |
| 2016/0133190 A1* | 5/2016 | Kim | G09G 3/2011 345/80 |
| 2016/0133684 A1* | 5/2016 | Cho | H01L 27/3279 257/99 |
| 2016/0181339 A1* | 6/2016 | Lee | H01L 27/1248 257/40 |
| 2016/0204177 A1* | 7/2016 | Kim | H01L 27/1222 257/40 |
| 2016/0225318 A1* | 8/2016 | Choi | G09G 3/3258 |
| 2016/0293883 A1* | 10/2016 | Hong | H01L 51/5246 |
| 2016/0300864 A1* | 10/2016 | Seo | H01L 27/3265 |
| 2016/0321996 A1* | 11/2016 | Lee | G09G 3/3258 |
| 2016/0322445 A1* | 11/2016 | Lee | H01L 51/5253 |
| 2016/0372534 A1* | 12/2016 | Lee | H01L 27/3276 |
| 2017/0040394 A1* | 2/2017 | Huang | H01L 27/1225 |
| 2017/0040407 A1* | 2/2017 | Shin | H01L 27/3276 |
| 2017/0104046 A1* | 4/2017 | Seo | H01L 27/3258 |
| 2017/0141169 A1* | 5/2017 | Sim | H01L 51/56 |
| 2017/0141172 A1* | 5/2017 | Cho | H01L 51/56 |
| 2017/0148856 A1* | 5/2017 | Choi | H01L 27/3258 |
| 2017/0162637 A1* | 6/2017 | Choi | G09G 3/3225 |
| 2017/0271416 A1* | 9/2017 | Ryu | H01L 27/3227 |
| 2017/0373094 A1* | 12/2017 | Park | H01L 27/3265 |
| 2018/0033847 A1* | 2/2018 | Kim | H01L 27/3246 |
| 2019/0051669 A1* | 2/2019 | Lee | H01L 27/124 |

\* cited by examiner

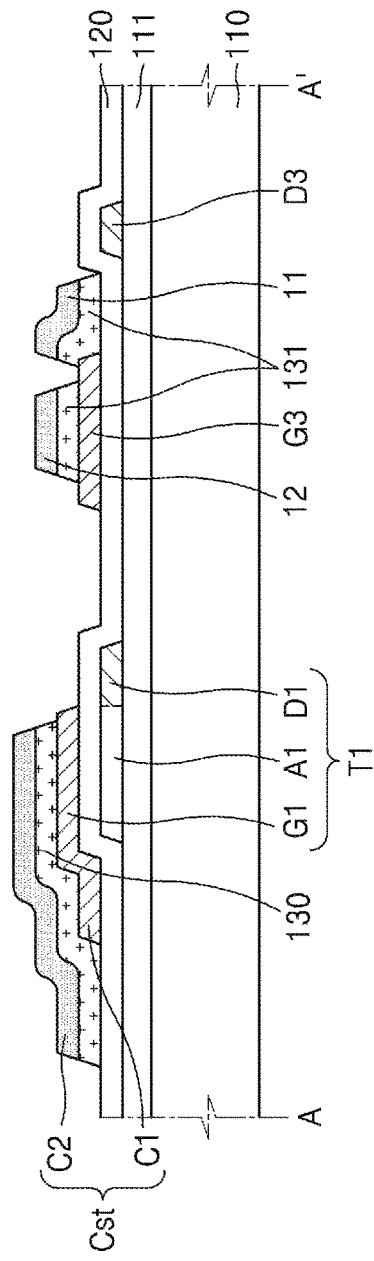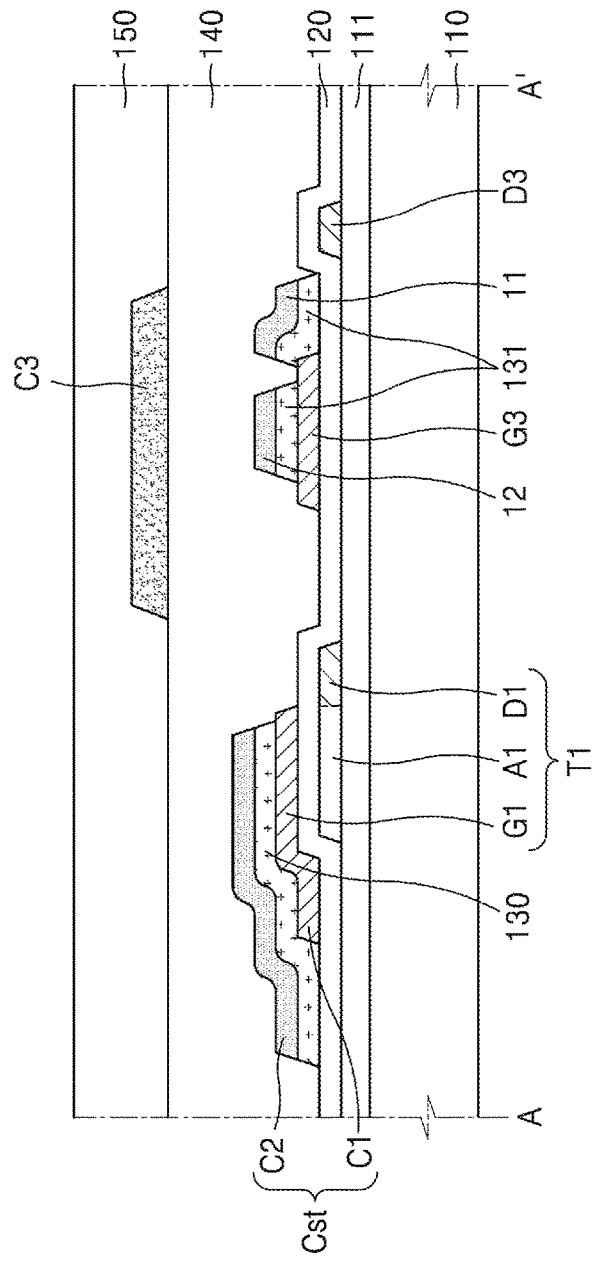

DISPLAY APPARATUS AND MANUFACTURING METHOD OF THE SAME

This application claims priority to Korean Patent Application No. 10-2017-0172645, filed on Dec. 14, 2017, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus.

2. Description of the Related Art

In general, a display apparatus includes a display element and electronic elements which control an electrical signal applied to the display element. The electronic elements include a thin film transistor ("TFT"), a capacitor and a plurality of wirings or electrodes.

Research is actively being conducted into arrangement of thin film transistors, capacitors, wirings, electrodes and contact plugs which connect these elements, which allows accurate control of whether light is emitted from display elements and to what degree the light is emitted, and also provides a high resolution and a high degree of integration.

SUMMARY

One or more embodiments include a display apparatus that provides a relatively high resolution and a high degree of integration, and a method of manufacturing the display apparatus.

However, the objective is an example, and the scope of the present disclosure is not limited thereto.

Additional features will be set forth in part in the description which follows and, in part, will be apparent from the description, or may be learned by practice of the presented embodiments.

According to one or more embodiments, a display apparatus includes a plurality of pixels with which an image is displayed, each of the plurality of pixels including a substrate on which are disposed: an interlayer insulating layer; a driving thin film transistor in which a driving semiconductor layer and a driving gate electrode are each disposed between the substrate and the first interlayer insulating layer; a first capacitor in which a first electrode, a first dielectric pattern and a second electrode are sequentially stacked to each be between the substrate and the interlayer insulating layer, the first electrode being connected to the driving gate electrode of the driving thin film transistor; and a plurality of contact plugs extended through a thickness of the interlayer insulating layer, with which the driving thin film transistor and the first capacitor are respectively connected to electrodes outside thereof. Lateral surfaces of the first dielectric pattern within the first capacitor are covered by the interlayer insulating layer, and the first dielectric pattern within the first capacitor is disposed spaced apart from each of the contact plugs.

The electrodes outside of the driving thin film transistor and the first capacitor may include: a first electrode which disposes the interlayer insulating layer between the driving thin film transistor and the first electrode, and a second electrode which disposes the interlayer insulating layer between the first capacitor and the second electrode. The plurality of contact plugs may include: a first contact plug with which the driving thin film transistor is connected to the first electrode outside thereof, and a second contact plug with which the first capacitor is connected to the second electrode outside thereof.

A permittivity of the first dielectric pattern may be greater than a permittivity of the interlayer insulating layer.

The display apparatus may further include a scan line through which a control signal is transmitted to control transmission of a data signal to the driving thin film transistor, disposed in and formed from a same single material layer as the second electrode of the first capacitor, and a second dielectric pattern disposed between the substrate and the scan line, disposed in and formed from a same single material layer as the first dielectric pattern of the first capacitor.

The first dielectric pattern may include at least one of $ZrO_2$, $TiO_2$, $Ta_2O_5$, $Al_2O_3$, $SrTiO_3$, and $BaTiO_3$, and the interlayer insulating layer may include at least one of silicon oxide, silicon nitride, and silicon oxynitride.

Lateral surfaces of the first dielectric pattern may be aligned with lateral surfaces of the second electrode.

The display apparatus may further include a lower insulating layer between the first electrode and the first dielectric pattern, and at least one of the plurality of contact plugs further extends through a thickness of the lower insulating layer.

The first dielectric pattern may extend further than ends of the second electrode to expose opposing ends of the first dielectric pattern from the second electrode.

The driving gate electrode may form a single body with the first electrode.

The driving thin film transistor may overlap the first capacitor.

Each of the plurality of pixels may further include: an organic light-emitting device with which light is emitted to display the image. The electrodes outside of the driving thin film transistor and the first capacitor may include a connection electrode to which driving thin film transistor is connected, among the contact plugs, a connection contact plug may extend from the connection electrode to connect a driving drain region of the driving semiconductor layer in the driving thin film transistor to the connection electrode; and the organic light-emitting device may be connected to the connection electrode connected to the driving drain region of the driving thin film transistor.

According to one or more embodiments, a method of manufacturing a display apparatus includes forming a plurality of pixels with which an image is displayed, including on a substrate: forming a driving thin film transistor including a driving gate electrode; forming a first electrode of a first capacitor; forming a dielectric material layer covering the substrate, and the driving gate electrode and the first electrode thereon; forming a metal material layer which disposes the dielectric material layer between the first electrode of the first capacitor and the metal material layer; forming a second electrode of the first capacitor from the metal material layer by etching the metal material layer in a first etching process; forming a first dielectric pattern of the first capacitor from the dielectric material layer by etching the dielectric material layer in a second etching process; forming a first interlayer insulating layer covering the driving thin film transistor and the second electrode and the first dielectric pattern of the first capacitor; and forming a plurality of contact holes extending through a thickness of the first interlayer insulating layer at which the driving thin film transistor and the first capacitor are respectively connected to electrodes outside thereof. Each of the plurality of contact holes is disposed spaced apart from the first dielectric pattern of the first capacitor.

The method may further include forming on the first interlayer insulating layer, a second capacitor in which a third electrode, a second interlayer insulating layer and a fourth electrode are sequentially stacked in a direction away from the first interlayer insulating layer. Each of the plurality of contact holes disposed spaced apart from the dielectric pattern of the first capacitor may further extend through the second interlayer insulating layer between the third and fourth electrodes of the second capacitor.

The second etching process may include etching the dielectric material layer by using the second electrode as a mask layer.

The method may further include forming a photoresist pattern on the metal material layer disposing the dielectric material layer between the first electrode of the first capacitor and the metal material layer metal material, where a same photoresist pattern may be used in the first etching process for forming the second electrode of the first capacitor from the metal material layer and the second etching process for forming the first dielectric pattern from the dielectric material layer.

The same photoresist pattern used in the first etching process and the second etching process may be formed using a halftone-mask, and using the same photoresist pattern formed using the halftone-mask may form within the first capacitor, a planar area of the first dielectric pattern greater than a planar.

The method may further include forming a lower insulating layer on an entirety of the substrate to be disposed between the first electrode and the dielectric material layer, where the lower insulating layer functions as an etch stopper in the second etching process.

The forming of the driving thin film transistor may form a driving semiconductor layer between the substrate and the driving gate electrode, and a first contact hole among the plurality of contact holes disposed spaced apart from the dielectric pattern of the first capacitor may further extend through a thickness of the lower insulating layer to expose the driving semiconductor layer of the driving thin film transistor.

A permittivity of the dielectric material layer may be greater than a permittivity of the first interlayer insulating layer.

The dielectric material layer may include at least one of $ZrO_2$, $TiO_2$, $Ta_2O_5$, $Al_2O_3$, $SrTiO_3$, and $BaTiO_3$, and the first interlayer insulating layer may include at least one of silicon oxide, silicon nitride, and silicon oxynitride.

BRIEF DESCRIPTION OF THE DRAWINGS

These and/or other features will become apparent and more readily appreciated from the following description of the embodiments, taken in conjunction with the accompanying drawings in which:

FIGS. 12A through 12F are cross-sectional views sequentially illustrating embodiments of operations within a method of manufacturing the display apparatus of FIG. 9.

DETAILED DESCRIPTION

Figure 1:
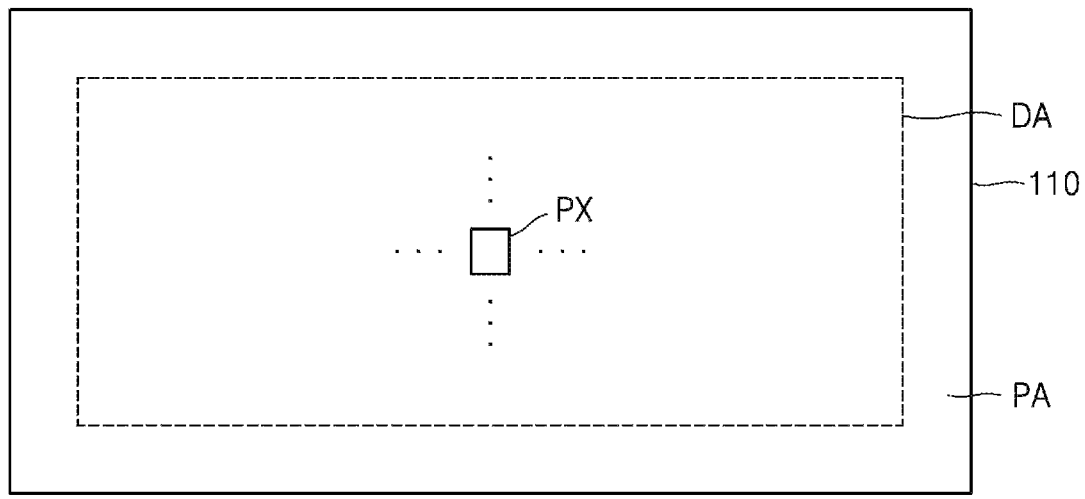
FIG. 1 is a top plan view illustrating an embodiment of a display apparatus according to the invention.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

An expression used in the singular encompasses the expression of the plural, unless it has a clearly different meaning in the context. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Expressions such as "at least one of," when preceding a list of elements, modify the entire list of elements and do not modify the individual elements of the list. In the embodiments below, it will be further understood that the terms "comprise" and/or "have" used herein specify the presence of stated features or components, but do not preclude the presence or addition of one or more other features or components.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components must not be limited to the above terms. The above terms are used only to distinguish one component from another.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Throughout the specification, it will also be understood that when a layer, a region, or an element is referred to as being related to another element such as being "connected to" another layer, region or element, it can be directly connected to the other layer, region or element, or it can be indirectly connected to the other layer, region or element with intervening layers, regions or elements present. For example, when a layer, a region, or an element is referred to as being "electrically connected to" another layer, region or element, it can be directly electrically connected to the other layer, region or element, or it can be indirectly electrically connected to the other layer, region or element with intervening layers, regions or elements present. In contrast, when a layer, a region, or an element is referred to as being related to another element such as being "directly connected to" another layer, region or element, no intervening layers, regions or elements are present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a top plan view illustrating an embodiment of a display apparatus according to the invention.

A pixel PX provided in plurality may be arranged in a display area DA of a substrate 110 within a display panel of the display apparatus. An image may be displayed in the display area DA. The pixels PX may include various display elements such as an organic light-emitting device ("OLED") with which an image displayed using light. Various wirings through which an electrical signal to be applied to the display area DA is transmitted may be located in a peripheral area PA of the substrate 119. The various wirings may be connected to the display elements in the display area DA. An image may not be displayed in the peripheral area PA. The display area DA and the peripheral area PA may together define an entirety of a planar area of the substrate 110.

The display apparatus and components thereof are disposed in a plane defined by a first direction DR1 and a second direction DR2 which crosses the first direction. IN FIG. 1, the first and second directions DR1 and DR2 are in the horizontal and vertical directions (or vice-versa). A thickness of the display apparatus and components thereof is taken in a third direction which crosses each of the first and second directions DR1 and DR2. In FIG. 1, the thickness direction is extends into the page.

Hereinafter, a display apparatus including an organic light-emitting device as a display element which self-emits light will be described for convenience. However, the present disclosure is not limited thereto, and may also apply to a display apparatus including a display element which is not self-emissive and receives light from a light source external thereto to display an image. One or more embodiment of the display apparatus according to the invention may be applied to various display apparatuses such as a liquid crystal display apparatus, an electrophoretic display apparatus or an inorganic electroluminescent ("EL") display apparatus.

Figure 2:
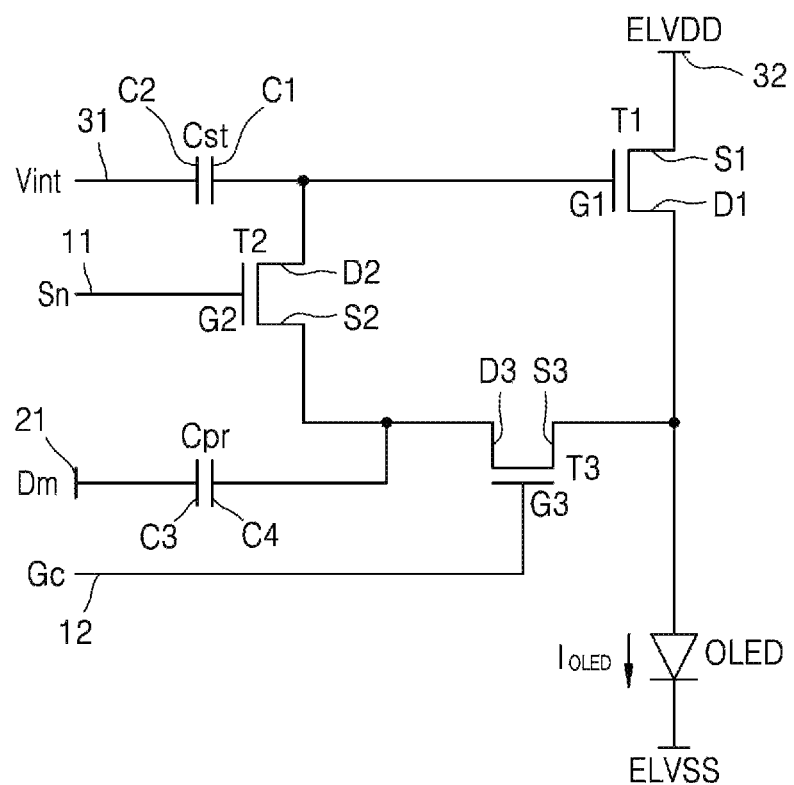
FIG. 2 is an equivalent circuit diagram of an embodiment of a pixel in the display apparatus of FIG. 1.

FIG. 2 is an equivalent circuit diagram of an embodiment of a pixel PX in the display apparatus of FIG. 1.

Referring to FIG. 2, the pixel PX includes signal lines 11, 12, and 21, a plurality of thin film transistors ("TFTs") T1, T2 and T3 connected to the signal lines 11, 12 and 21, a first capacitor Cst, a second capacitor Cpr, an initialization voltage line 31, a driving voltage line 32 and an organic light-emitting device OLED.

While FIG. 2 illustrates each one pixel PX including the signal lines 11, 12 and 21, the initialization voltage line 31 and the driving voltage line 32, the present disclosure is not limited thereto. According to another embodiment, at least one of the signal lines 11, 12 and 21, the initialization voltage line 31 or/and the driving voltage line 32 may be shared between adjacent pixels.

The TFTs T1, T2 and T3 may include a driving TFT T1, a switching TFT T2 and a compensation TFT T3.

The signal lines 11, 12 and 21 may include a scan line 11 through which a scan signal Sn is transmitted, a compensation control line 12 through which a compensation control signal GC is transmitted, and a data line 21 which crosses the scan line 11 and through which a data signal Dm is transmitted. A driving voltage ELVDD is transmitted through the driving voltage line 32 to the driving TFT T1, and an initialization voltage Vint is transmitted to the first capacitor Cst through the initialization voltage line 31.

A driving gate electrode G1 of the driving TFT T1 is connected to a first electrode C1 of the first capacitor Cst, a driving source electrode S1 of the driving TFT T1 is connected to the driving voltage line 32, and a driving drain electrode D1 of the driving TFT T1 is electrically connected to a pixel electrode of the organic light-emitting device OLED. The driving TFT T1 receives the data signal Dm according to a switching operation of the switching TFT T2 to supply a driving (electrical) current IDLED to the organic light-emitting device OLED.

A switching gate electrode G2 of the switching TFT T2 is connected to the scan line 11, a switching source electrode S2 of the switching TFT T2 passes by the second capacitor Cpr to be connected to the data line 21, and a switching drain electrode D2 of the switching TFT T2 is connected to the driving gate electrode G1 of the driving TFT T1. The switching TFT T2 is turned on according to the scan signal Sn received through the scan line 11 to perform a switching operation of transmitting the data signal Dm from the data line 21 to the driving TFT T1.

A compensation gate electrode G3 of the compensation TFT T3 is connected to the compensation control line 12, a compensation source electrode S3 of the compensation TFT T3 is connected to the pixel electrode of the organic light-emitting device OLED, and the compensation drain electrode D3 of the compensation TFT T3 passes by the switching source electrode S2 of the switching TFT T2 and the second capacitor Cpr to be connected to the data line 21. The compensation TFT T3 is turned on according to the compensation control signal GC applied to the compensation gate electrode G3 via the compensation control line 12.

The first capacitor Cst may be connected between the driving gate electrode G1 of the driving TFT T1 and the initialization voltage line 31 through which an initialization voltage Vint is supplied, to thereby function as a storage capacitor. The second capacitor Cpr may be connected between the switching source electrode S2 of the switching TFT T2 and the data line 21 through which the data signal Dm is supplied, to thereby function as a programming capacitor.

The data signal Dm applied to the second capacitor Cpr via an operation of the switching TFT T2 may be applied to the first capacitor Cst to thereby determine a driving gate voltage applied to the driving gate electrode G1 of the driving TFT T1, and the driving TFT T1 is turned on according to the driving gate voltage. Accordingly, the organic light-emitting device OLED may generate and emit light to display an image by receiving the driving current IDLED from the driving TFT T1.

Locations at which the source electrodes S1, S2 and S3 and the drain electrodes D1, D2 and D3 are arranged in FIG. 2 may be exchanged according to transistor types. In addition, while the driving TFT T1, the switching TFT T2 and the compensation TFT T3 illustrated in FIG. 2 are all nMOS transistors, the present disclosure is not limited thereto. In another embodiment, for example, the driving TFT T1, the switching TFT T2 and the compensation TFT T3 may be all pMOS type. Alternatively, some of the driving TFT T1, the switching TFT T2 and the compensation TFT T3 may be nMOS type, and remaining TFTs may be pMOS type. As such, various modifications may be made.

While three TFTs and two capacitors are illustrated within the pixel PX of the embodiment of FIG. 2, the present disclosure is not limited thereto, and the number of TFTs and capacitors may be various within the pixel PX of the display apparatus.

Figure 3:
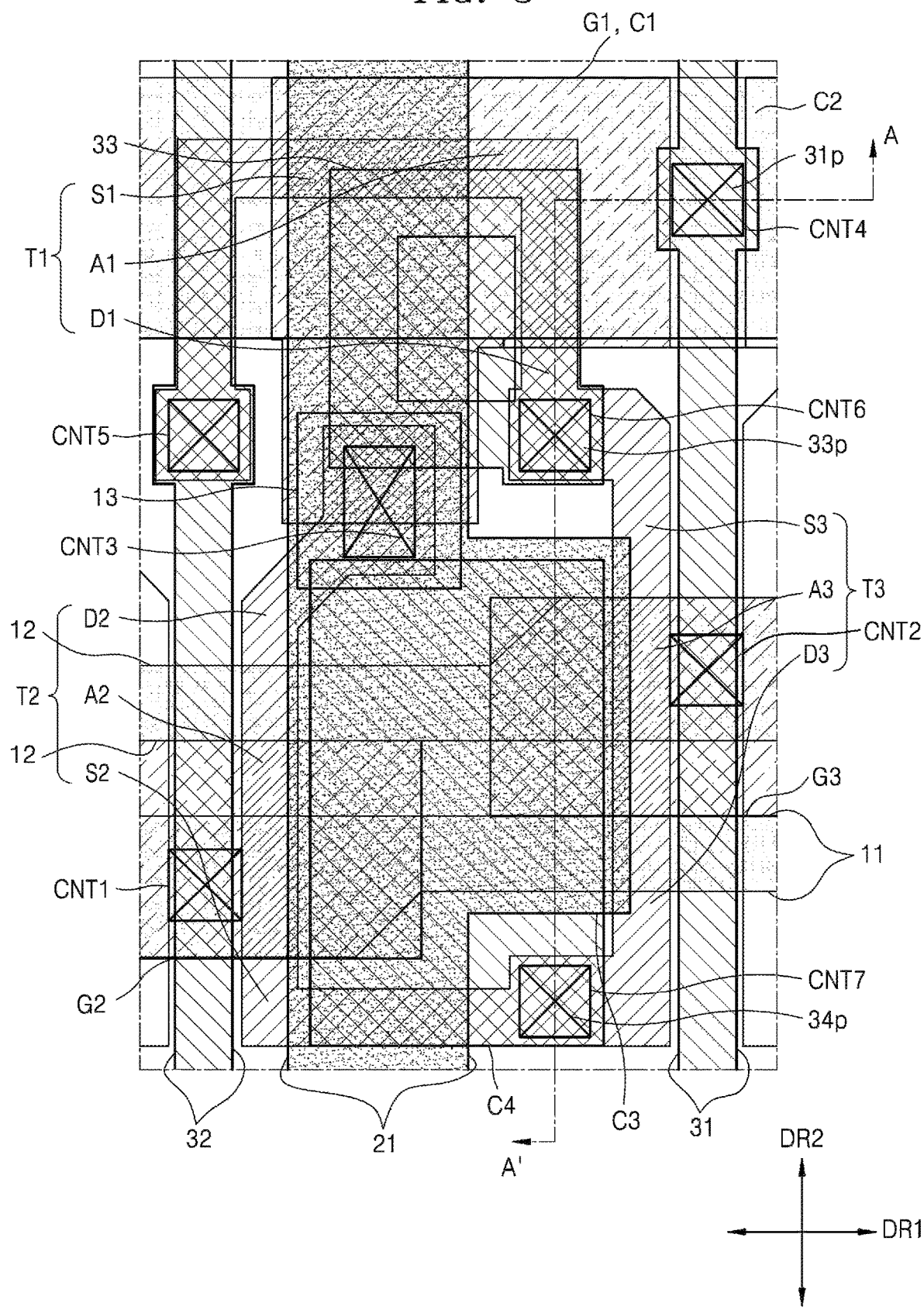
FIG. 3 is a an enlarged top plan view illustrating a plurality of thin film transistors and capacitors of the pixel of FIG. 2.

FIG. 3 is an enlarged top plan view illustrating an embodiment of locations of the plurality of TFTs T1, T2 and T3, the first capacitor Cst and the second capacitor Cpr of the pixel PX of FIG. 2. FIGS. 4 through 8 are enlarged top plan view illustrating individual layers of elements such as the plurality of TFTs T1, T2 and T3, the first capacitor and the second capacitor illustrated in FIG. 3. FIG. 9 is a cross-sectional view of the pixel PX of the display apparatus taken along line A-A' of FIG. 3.

FIGS. 4 through 8 respectively illustrate arrangements of wirings, electrodes, and semiconductor layers within a same level among single layers disposed on the substrate 110, and insulating layers disposed on the substrate 110 may be interposed between the layers illustrated in FIGS. 4 through 8 along a thickness direction of the display apparatus.

Figure 4:
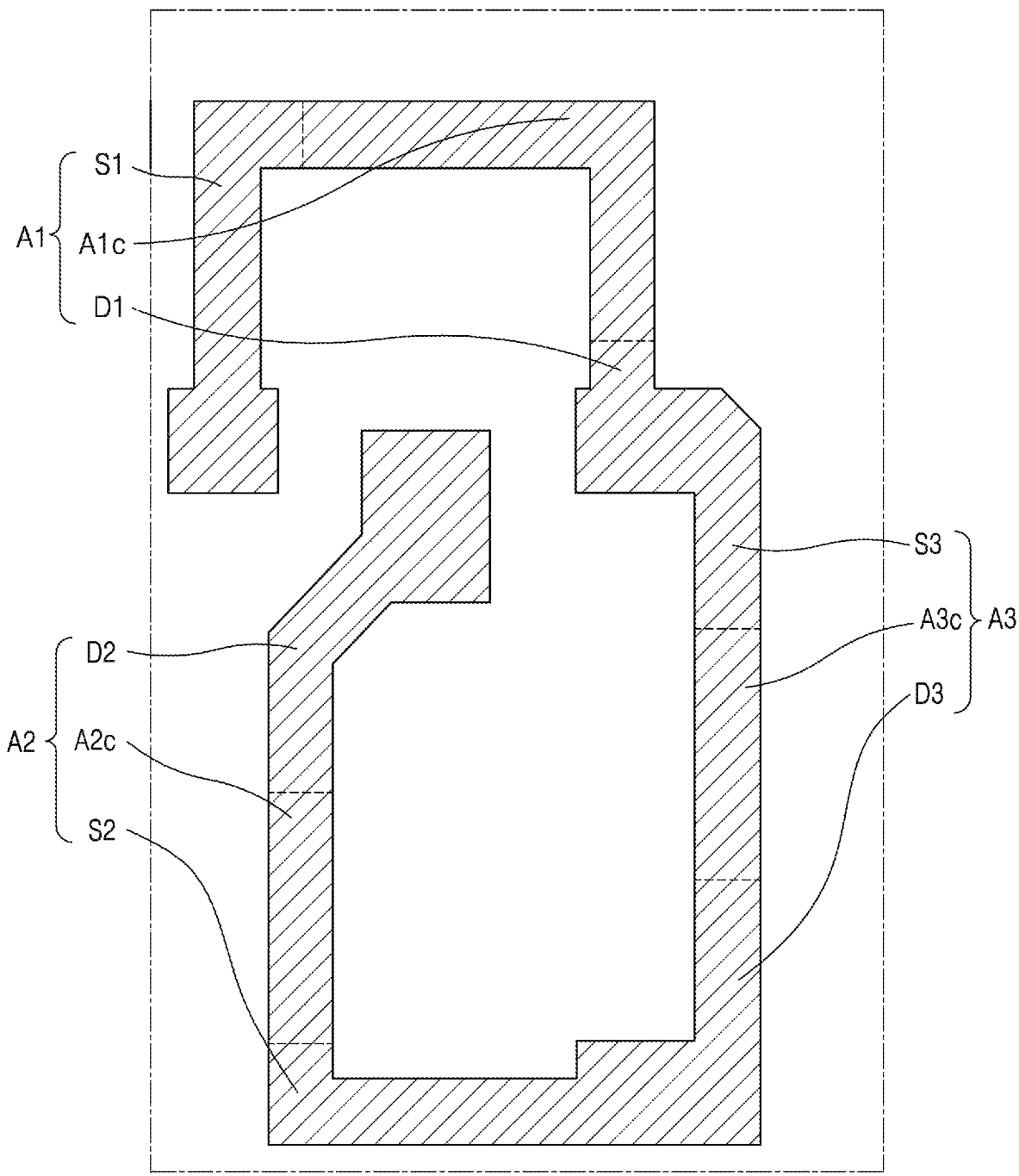
FIGS. 4 through 8 are enlarged top plan view illustrating individual layers of elements such as a plurality of thin film transistors, capacitors and pixel electrodes of the pixel of FIG. 3.
Figure 5:
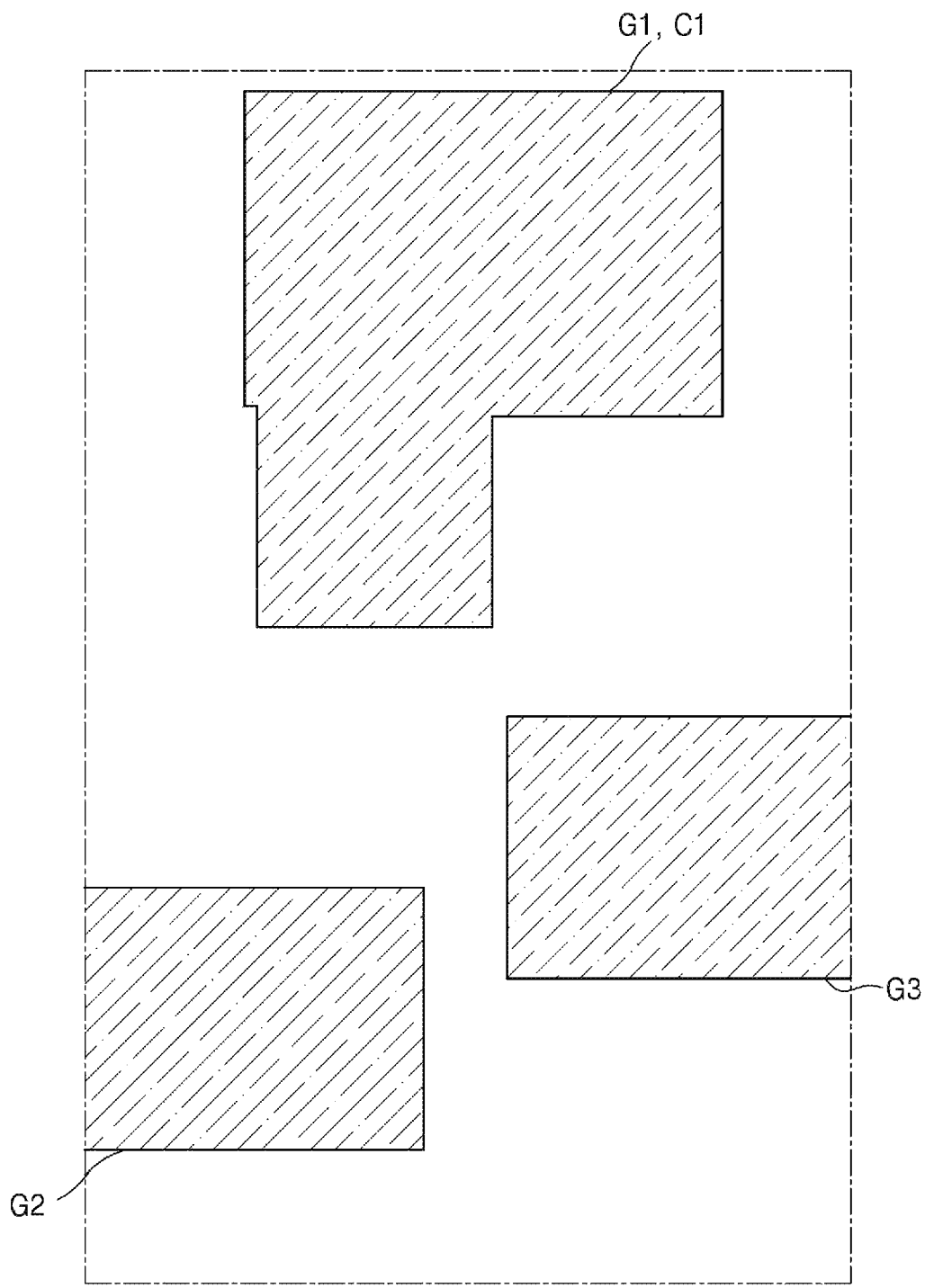
Figure 6:
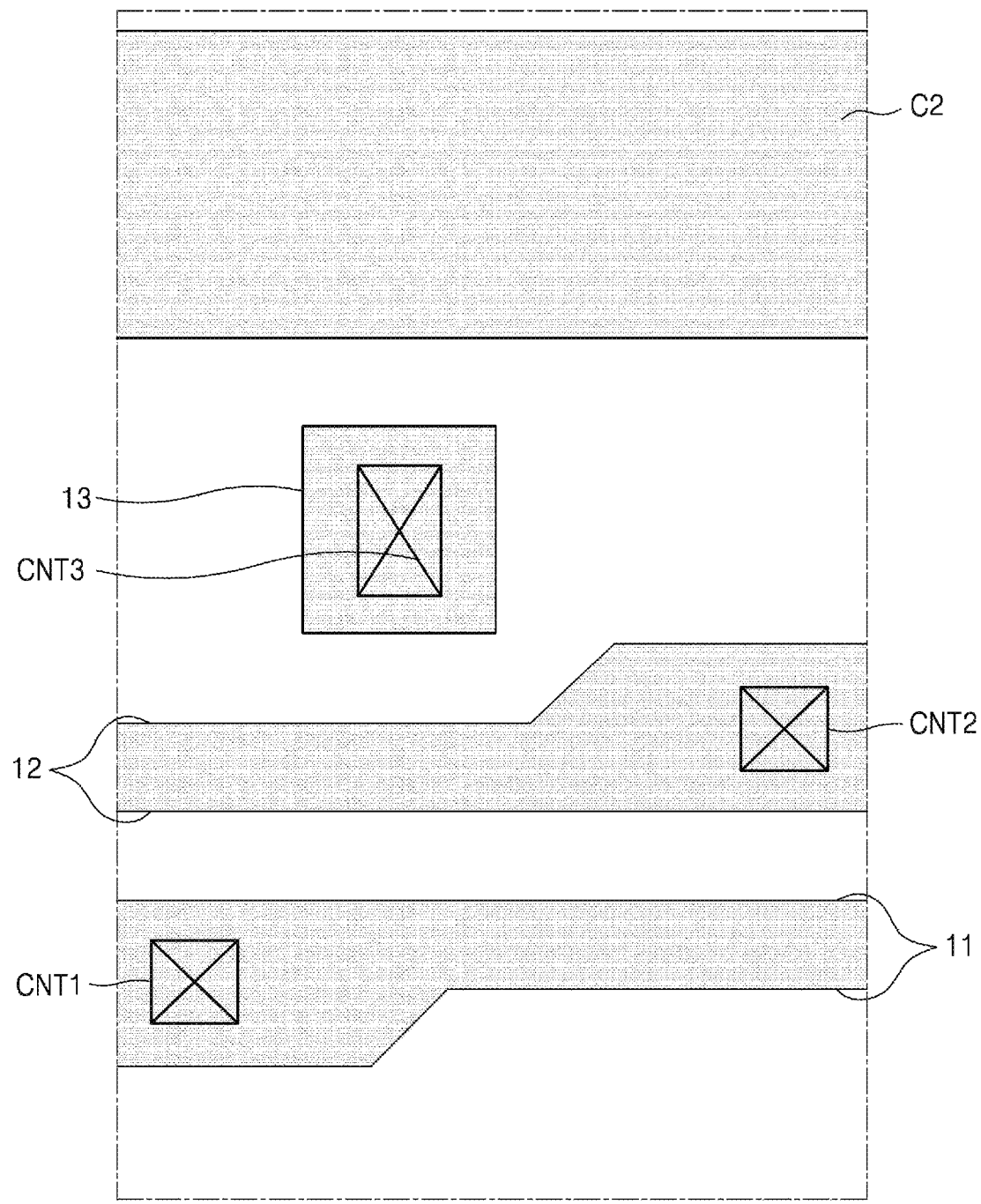
Figure 7:
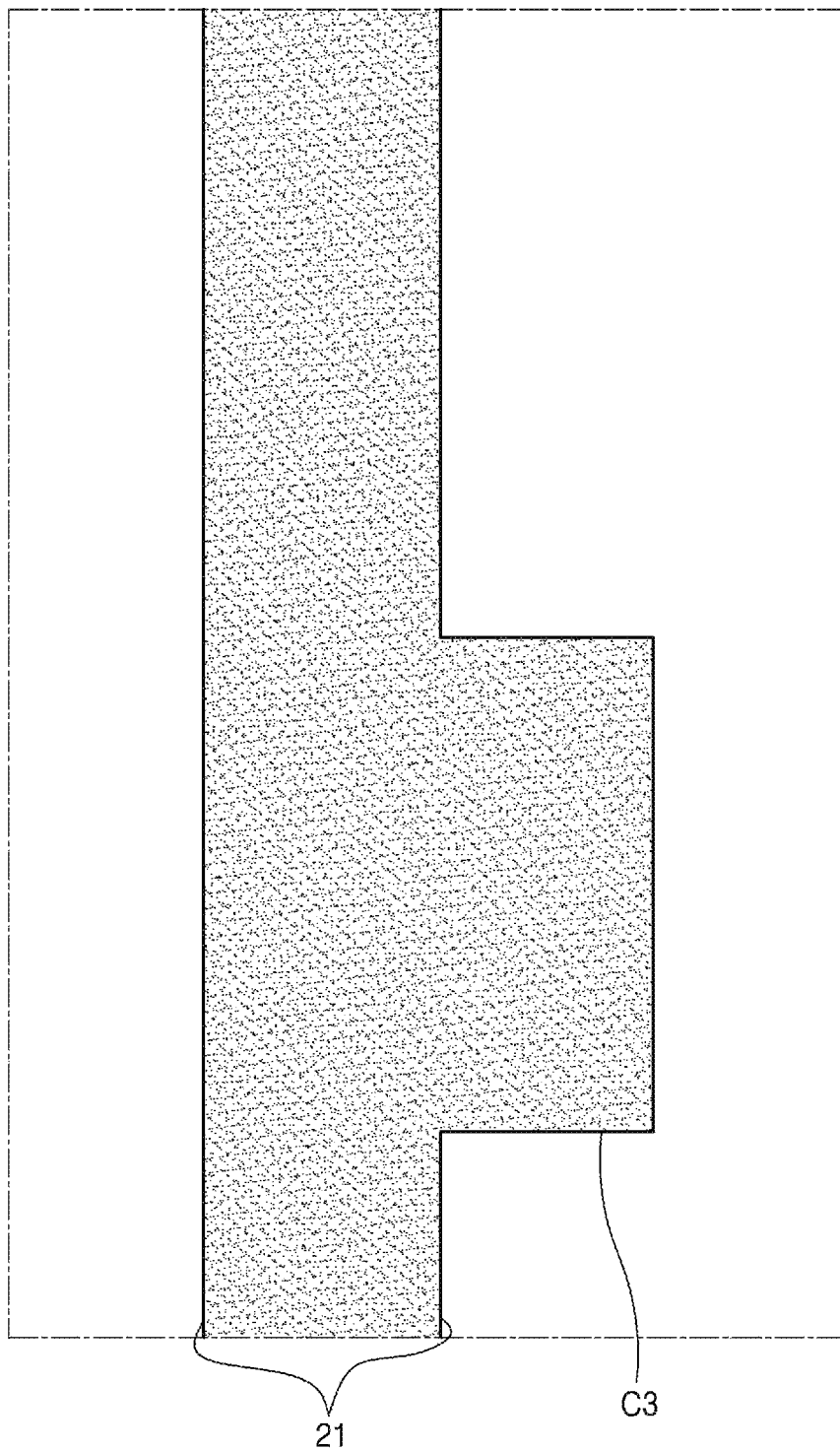

In an embodiment, for example, a gate insulating layer 120 (see FIG. 9) may be interposed between elements within the single layer illustrated in FIG. 4 and elements within the single layer illustrated in FIG. 5, a pattern-dielectric layer 130 (see FIG. 9) may be interposed between elements within the single layer illustrated in FIG. 5 and elements within the single layer illustrated in FIG. 6, and a first interlayer insulating layer 140 (see FIG. 9) may be interposed between elements within the single layer illustrated in FIG. 6 and elements within the single layer illustrated in FIG. 7. In addition, a second interlayer insulating layer 150 (see FIG. 9) may be interposed between elements within the single layer Illustrated in FIG. 7 and elements within the single layer illustrated in FIG. 8. The individual layers illustrated in FIGS. 4 through 8 may be electrically connected to one another through contact holes defined by and within some of the above-described insulating layers.

Referring to FIG. 3, the pixel PX includes portions of the scan line 11 and the compensation control line 12, through which a scan signal Sn and a compensation control signal GC are respectively applied, and each of which lengthwise extends in a first direction DR1 (e.g., horizontal). The pixel PX includes portions of the data line 21, the initialization voltage line 31 and the driving voltage line 32, which each lengthwise extend in a second direction DR2 (e.g., vertical) to cross the scan line 11 and the compensation control line 12, and through which a data signal Dm, an initialization voltage Vint and a driving voltage ELVDD are respectively applied. In addition, the pixel PX includes the TFTs T1 through T3, the first capacitor Cst, the second capacitor Cpr and the organic light-emitting device OLED (see FIG. 2) that are electrically connected to these elements. Hereinafter, for convenience, description will follow an order of stacking elements.

Referring to FIGS. 3, 4 and 9, a driving semiconductor (pattern) layer A1, a switching semiconductor (pattern) layer A2 and a compensation semiconductor (pattern) layer A3 of the driving TFT T1, the switching TFT T2 and the compensation TFT T3 are arranged in a same level or single layer among layers disposed on the substrate 110 and include a same material. In an embodiment, for example, the semiconductor layers A1, A2 and A3 may each include or be formed of polycrystalline silicon. In an embodiment of manufacturing a display apparatus, the semiconductor layers A1, A2 and A3 may all be formed from a same single material layer to be disposed in a same single within the display apparatus.

The driving semiconductor layer A1, the switching semiconductor layer A2 and the compensation semiconductor layer A3 are each arranged on a buffer layer 111 (see FIG. 9) on the substrate 110. The substrate 110 may include or be formed of a glass material, a metal material or a plastic material such as polyethylene terephthalate ("PET"), polyethylene naphthalate ("PEN") or polyimide. The buffer layer 111 may include or be formed of an oxide layer such as silicon oxide (SiOx) and/or a nitride layer such as silicon nitride (Sinx), in a single-layer structure or multi-layer structure.

The driving semiconductor layer A1 of the driving TFT T1, the switching semiconductor layer A2 of the switching TFT T2 and the compensation semiconductor layer A3 of the compensation TFT T3 may be connected to each other within the pixel PX to form a single, unitary element. The semiconductor layers may collectively form or define various planar shapes, curves, bends, etc.

Within the respective TFTs, the driving semiconductor layer A1, the switching semiconductor layer A2 and the compensation semiconductor layer A3 may include or define a channel region, and a source region and a drain region respectively at opposing end of the channel region. In an embodiment, for example, the source and drain regions may be doped with an impurity which may include an N-type impurity or a P-type impurity. The source and drain regions of the semiconductor layer within a TFT respectively correspond to a source electrode and a drain electrode connected thereto. Hereinafter, instead of a source electrode or a drain electrode, the terms 'source region' and 'drain region' will be used.

A length (direction) of the overall driving semiconductor layer A1 may be taken from a first distal end (at the driving semiconductor layer A1) to a second distal end (at the switching semiconductor layer A2). A width of the overall driving semiconductor layer A1 at a position thereof, may be taken perpendicular to the length direction of the region at such position. Dotted lines in FIG. 4 indicate a boundary between sections of the overall semiconductor (pattern) layer.

The driving semiconductor layer A1 includes a driving channel region A1c, and a driving source region S1 and a driving drain region D1 at opposing sides of the driving channel region A1c. The driving semiconductor layer A1 has length sections which form a curved shape so that a total length of the driving channel region A1c may be larger than a respective total length of other channel regions A2c and A3c. In an embodiment, for example, as the driving semiconductor layer A1 has a shape having multiple curved portions, like an omega shape or the letter "S," a relatively long channel length may be provided in a relatively small planar area. Due to the driving channel region A1c that is relatively long, a driving range of a gate voltage applied to the driving gate electrode G1 within the driving TFT T1 is extended, thereby allowing precise gradation control of light emitted from the organic light-emitting device OLED and enhancing display quality. The driving drain region D1 of the driving semiconductor layer A1 within the driving TFT T1 may be connected to the source region S3 of the compensation semiconductor layer A3. That is, a section (D1+S3) of the semiconductor layer in FIG. 4 may be common to and shared by the driving TFT T1 and the compensation TFT T3.

The switching semiconductor layer A2 includes a switching channel region A2c, and a switching source region S2 and a switching drain region S2 at opposing ends of the switching channel region A2c. The switching source region S2 of the switching semiconductor layer A2 within the switching TFT T2 may be connected to the compensation drain region D3 of the compensation semiconductor layer A3 within the compensation TFT T3. That is, a section (D3+S2) of the semiconductor layer in FIG. 4 may be common to and shared by the switching TFT T2 and the compensation TFT T3.

The compensation semiconductor layer A3 includes a compensation channel region A3c, and a compensation source region S3 and a compensation drain region D3 at opposing ends of the compensation channel region A3c. The compensation semiconductor layer A3 within the compensation TFT T3 may be disposed between the driving semiconductor layer A1 and the switching semiconductor layer A2, along a length of the overall semiconductor layer in FIG. 4. The compensation source region S3 of the compensation semiconductor layer A3 may be connected to the driving drain region D1, and the compensation drain region D3 of the compensation semiconductor layer A3 may be connected to the switching source region S2.

The gate insulating layer 120 is disposed on each of the semiconductor layers A1, A2 and A3. The gate insulating layer 120 may include an inorganic material including an oxide or a nitride. In an embodiment, for example, the gate insulating layer 120 may include silicon oxide ($SiO_2$), silicon nitride (SiNx) or silicon oxynitride (SiON).

Referring to FIGS. 3, 5 and 9, the driving gate electrode G1, the switching gate electrode G2 and the compensation gate electrode G3 are each disposed on the gate insulating layer 120. The driving gate electrode G1, the switching gate electrode G2 and the compensation gate electrode G3 are disposed in a same level or single layer among layers disposed on the substrate 110 and include a same material. In an embodiment, for example, the driving gate electrode G1, the switching gate electrode G2 and the compensation gate electrode G3 may include molybdenum (Mo), aluminum (Al), copper (Cu), or titanium (Ti), and have a single-layer or multi-layer structure. In an embodiment of manufacturing a display apparatus, the gate electrodes G1, G2 and G3 may all be formed from a same single material layer to be disposed in a same single layer within the display apparatus.

The driving gate electrode G1, the switching gate electrode G2 and the compensation gate electrode G3 have an island shape in the top plan view, and are disposed to respectively overlap the channel regions of the driving semiconductor layer A1, the switching semiconductor layer A2 and the compensation semiconductor layer A3. The driving gate electrode G1 may function not only as a gate electrode of the driving TFT T1, but also as the first electrode C1 of the first capacitor Cst. That is, the driving gate electrode G1 and the first electrode C1 may be regarded as a single body. As the driving gate electrode G1 and the first electrode C1 are formed as a single body, the driving gate electrode G1 and the first capacitor Cst (defined with the first electrode C1) overlap each other, thus providing a relatively high integration degree.

The pattern-dielectric layer 130 is disposed on each of the driving gate electrode G1, the switching gate electrode G2 and the compensation gate electrode G3. The pattern-dielectric layer 130 includes a material having a relatively high dielectric constant so that the pattern-dielectric layer 130 may have a greater permittivity than the gate insulating layer 120, the first interlayer insulating layer 140 or the second interlayer insulating layer 150 which will be described later. In an embodiment, for example, the pattern-dielectric layer 130 may include at least one of zirconium oxide ($ZrO_2$), titanium oxide ($TiO_2$), tantalum oxide ($Ta_2O_5$), aluminum oxide ($Al_2O_3$), $SrTiO_3$ and $BaTiO_3$.

Referring to FIGS. 3, 6 and 9, the scan line 11, the compensation control line 12, the second electrode C2 of the first capacitor Cst and a first connection electrode 13 are each arranged on the pattern-dielectric layer 130. The scan line 11, the compensation control line 12, the second electrode C2 of the first capacitor Cst and the first connection electrode 13 are arranged in a same level or single layer among layers disposed on the substrate 110 and include a same material. In an embodiment, for example, the scan line 11, the compensation control line 12, the second electrode C2 of the first capacitor Cst and the first connection electrode 13 may include molybdenum (Mo), aluminum (Al), copper (Cu), or titanium (Ti) and have a single-layer or multi-layer structure. In an embodiment of manufacturing a display apparatus, the signal lines and electrodes 11, 12, 13 and C2 may all be formed from a same single material layer to be disposed in a same single layer within the display apparatus.

The scan line 11 may be connected to the underlying switching gate electrode G2 via a (conductive) contact plug in a first contact hole CNT1 defined by and in the pattern-dielectric layer 130, and the compensation control line 12 may be connected to the underlying compensation gate electrode G3 via a (conductive) contact plug in a second contact hole CNT2 defined by and in the pattern-dielectric layer 130. The first connection electrode 13 has an island (e.g., discrete) shape in the top plan view, and may be connected to the switching drain region D2 of the underlying switching semiconductor layer A2 and the driving gate electrode G1 via a contact plug in a third (conductive) contact hole CNT3 defined by and in the pattern-dielectric layer 130.

A length of the second electrode C2 of the first capacitor Cst may extend in the first direction DR1 to be commonly connected to adjacent pixels along the first direction DR1, and is arranged to overlap with the underlying first electrode C1 of the first capacitor Cst. An electrostatic capacitance of the first capacitor Cst is defined by an overlapping planar area between the first electrode C1 and the second electrode C2, a permittivity of the pattern-dielectric layer 130 between the first electrode C1 and the second electrode C2, or the like.

According to the present embodiment, as the pattern-dielectric layer 130 includes a material of a relatively high dielectric constant, even if an overlapping area between the first electrode C1 and the second electrode C2 is limited, electrostatic capacitance of the first capacitor Cst may be increased. According to the present embodiment, the pattern-dielectric layer 130 is not disposed over the entire surface of the substrate 110, but in selective planar areas. That is, the pattern-dielectric layer 130 is mainly disposed between the first electrode C1 and the second electrode C2 of the first capacitor Cst. Accordingly, as an amount of parasitic capacitance that may occur between conductive material layers decreases owing to the pattern-dielectric layer 130, a high-quality display apparatus may be implemented.

In some embodiments, the pattern-dielectric layer 130 may be included to correspond to planar shapes of the scan line 11, the compensation control line 12, the second electrode C2 of the first capacitor Cst and/or the first connection electrode 13. The corresponding shapes may be defined in manufacturing the display apparatus such as when a material layer for forming the pattern-dielectric layer 130 is etched by using overlying shapes of the scan line 11, the compensation control line 12, the second electrode C2 of the first capacitor Cst and the first connection electrode 13 as a metal mask. This will be described later.

The first interlayer insulating layer 140 covering the scan line 11, the compensation control line 12, the second electrode C2 of the first capacitor Cst and the first connection electrode 13 is located on the scan line 11, the compensation control line 12, the second electrode C2 of the first capacitor Cst and the first connection electrode 13. The first interlayer insulating layer 140 may include an inorganic material including an oxide or a nitride. In an embodiment, for example, the first interlayer insulating layer 140 may include silicon oxide ($SiO_2$), silicon nitride (SiNx), or silicon oxynitride (SiON).

Referring to FIGS. 3, 7 and 9, the data line 21 and a third electrode C3 which is a bottom electrode of the second capacitor Cpr are disposed on the first interlayer insulating layer 140. A portion or a protruding portion of the data line 21 corresponds to and defines the third electrode D3 which is the bottom electrode of the second capacitor Cpr.

The data line 21 may include a conductive material including, for example, molybdenum (Mo), aluminum (Al), copper (Cu), or titanium (Ti), and may be formed in a single-layer or multi-layer structure including at least one of the above materials. In an embodiment, for example, the data line 21 may have a multi-layer structure of Ti/Al/Ti.

The second interlayer insulating layer 150 is disposed on the data line 21. The second interlayer insulating layer 150 may include an inorganic material including an oxide or a nitride. In an embodiment, for example, the second interlayer insulating layer 150 may include silicon oxide ($SiO_2$), silicon nitride (SiNx), or silicon oxynitride (SiON).

Figure 8:
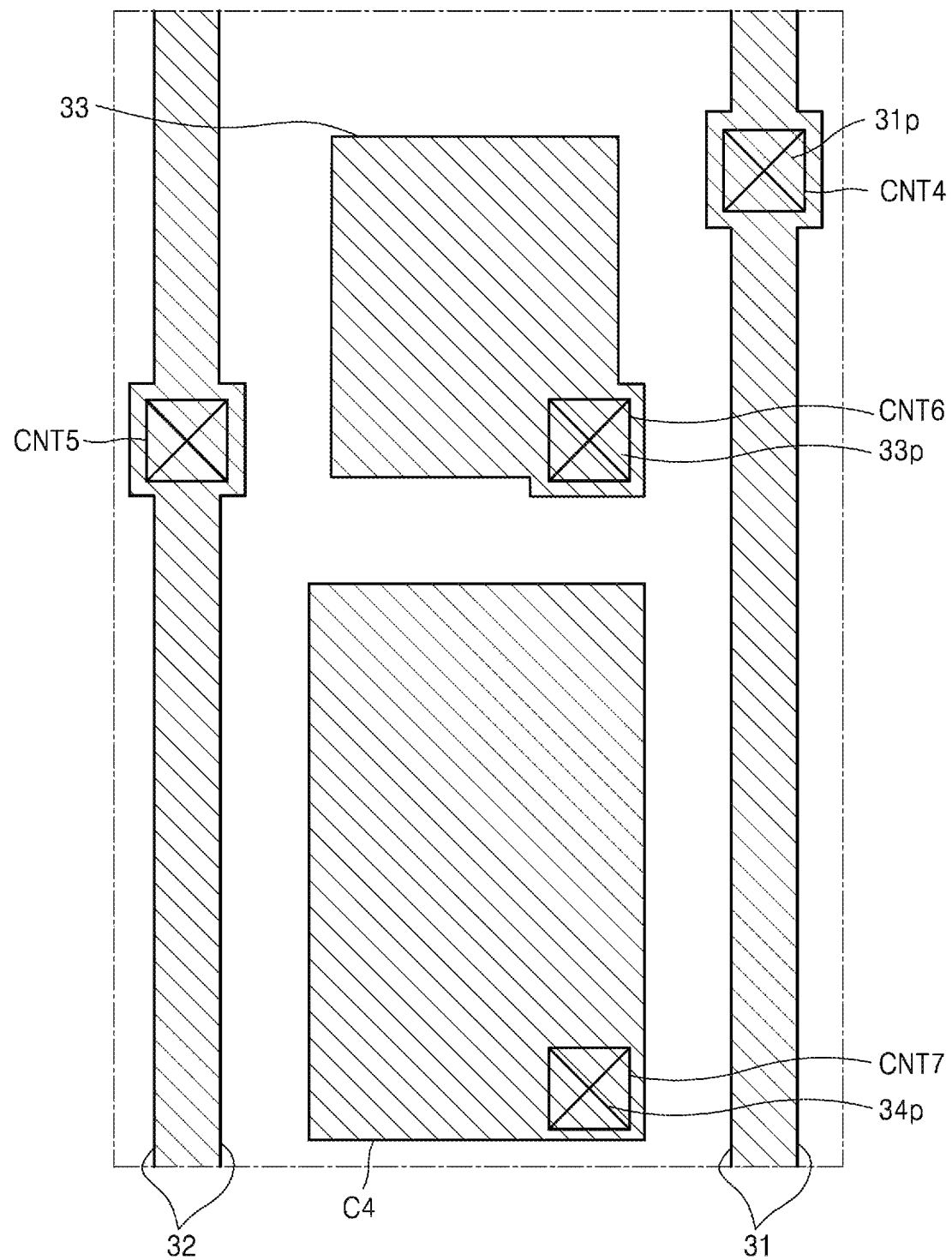
Figure 9:
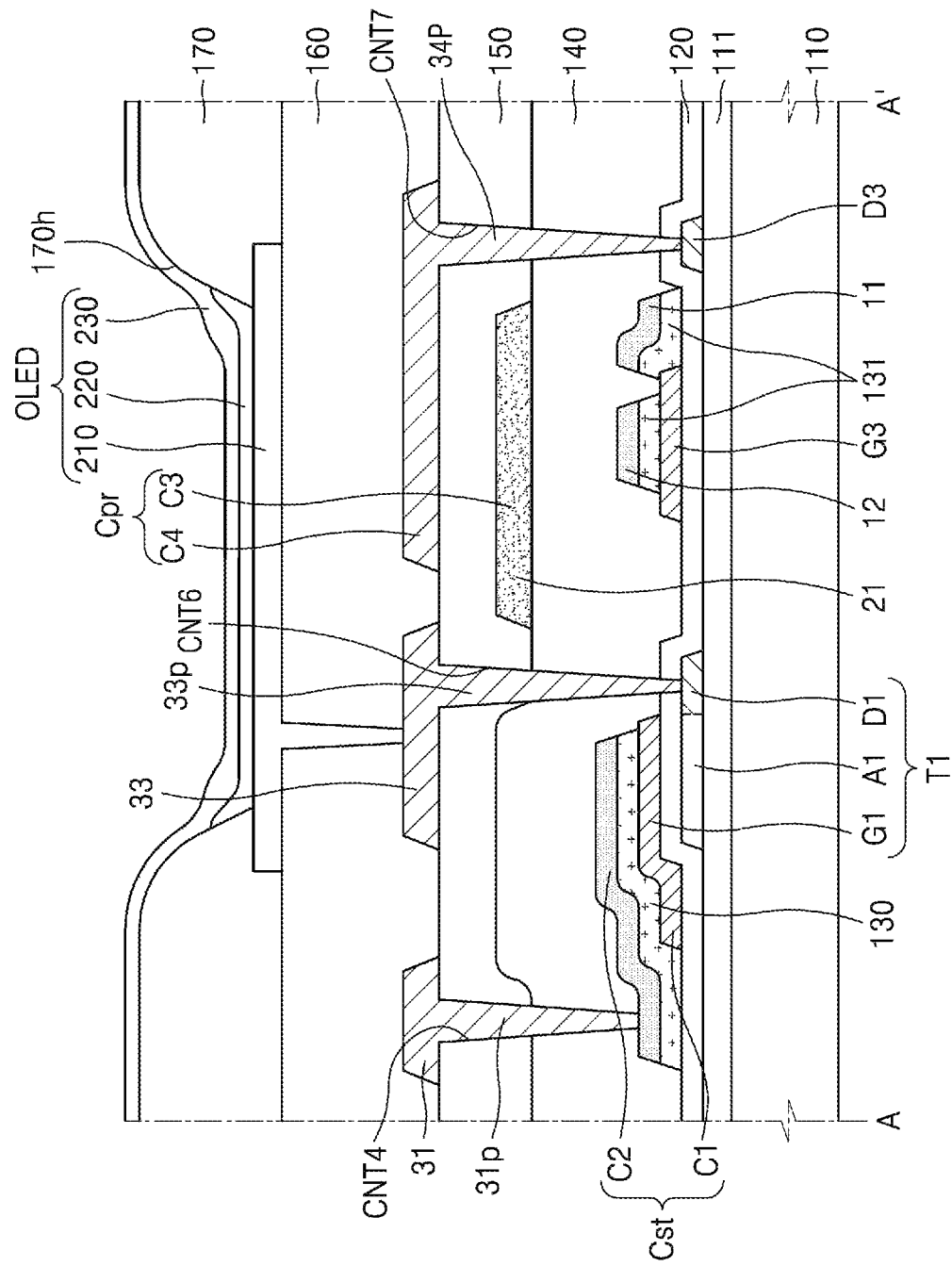
FIG. 9 is a cross-sectional view taken along line A-A' of FIG. 3.

Referring to FIGS. 3, 8, and 9, the initialization voltage line 31, the driving voltage line 32, a second connection electrode 33, and a fourth electrode C4, which is a top electrode of the second capacitor Cpr, are disposed on the second interlayer insulating layer 150.

The initialization voltage line 31, the driving voltage line 32, the second connection electrode 33, and the fourth electrode C4 which is the top electrode of the second capacitor Cpr are disposed in a same level or single layer among layers disposed on the substrate 110 and include a same material. In an embodiment, the initialization voltage line 31, the driving voltage line 32, the second connection electrode 33, and the fourth electrode C4 which is the top electrode of the second capacitor Cpr may include a conductive material including, for example, molybdenum (Mo), aluminum (Al), copper (Cu), or titanium (Ti), and may be formed in a single-layer or multi-layer structure including the material above. In an embodiment, for example, the fourth electrode C4 which is the top electrode of the second capacitor Cpr may have a multi-layer structure of Ti/Al/Ti. In an embodiment of manufacturing a display apparatus, the initialization voltage line 31, the driving voltage line 32, the second connection electrode 33, and the fourth electrode C4 may all be formed from a same single material layer to be disposed in a same single layer within the display apparatus.

The initialization voltage line 31 may be connected to the second electrode C2 of the first capacitor Cst via a (conductive) contact plug 31p in a fourth contact hole CNT4 passing through the second interlayer insulating layer 150 and the first interlayer insulating layer 140. The driving voltage line 32 may be connected to the driving source region S1 of the driving TFT T1 via a contact plug in a fifth contact hole CNT5 passing through the second interlayer insulating layer 150, the first interlayer insulating layer 140 and the gate insulating layer 120. The second connection electrode 33 may be connected to the driving drain region D1 of the driving TFT T1 through a (conductive) contact plug 33p in a sixth contact hole CNT6. The second connection electrode 33 may be connected to a pixel electrode 210 to transmit a driving current IDLED to the pixel PX.

The fourth electrode C4 which is the top electrode of the second capacitor Cpr may be connected to the source region S2 of the switching TFT T2 and the drain region D3 of the compensation TFT T3 through a contact plug 34p in a seventh contact hole CNT7 passing through the second interlayer insulating layer 150, the first interlayer insulating layer 140, and the gate insulating layer 120. The fourth electrode C4 may overlap with the third electrode C3 with the second interlayer insulating layer 150 included therebetween, to thereby form the second capacitor Cpr.

A planarization layer 160 is disposed on the initialization voltage line 31, the driving voltage line 32, the second connection electrode 33 and the fourth electrode C4 which is the top electrode of the second capacitor Cpr. The planarization layer 160 has a planar (e.g., flat) top surface, and may include an organic material or an inorganic material such as acryl, benzocyclobutene ("BCB"), polyimide or hexamethyldisiloxane ("HMDSO") or an inorganic material. In some embodiments of manufacturing a display apparatus, a chemical mechanical polishing ("CMP") process may be performed to form the planarization layer 160.

Referring to FIG. 9, an organic light-emitting device OLED is disposed on the planarization layer 160. The organic light-emitting device OLED includes the pixel electrode 210, an intermediate layer 220 including an organic emissive layer, and an opposite electrode 230. A light emission area of the organic light-emitting device OLED is defined by an opening portion 170h of the pixel defining layer 170. One of the pixel electrode 210 and the opposite electrode 230 of the organic light-emitting device OLED functions as an anode electrode, and the other functions as a cathode electrode. Light is emitted at the light emission area of the pixel PX for displaying an image. A remainder of the pixel PX except for the light emission area may be an area at which light is not emitted for displaying the image.

The pixel defining layer 170 covers outer edges of the pixel electrode 210, and defines the opening portion 170h at which the pixel electrode 210 is exposed. The intermediate layer 220 including an organic emissive layer is disposed on the pixel electrode 210 exposed through the opening portion 170h, and the opposite electrode 230 is disposed on the intermediate layer 220 so that light is generated in the intermediate layer 220 between the pixel electrode 210 and the opposite electrode 230. Thus, a light emission area of a pixel PX may be regarded to be defined by the opening portion 170h. The pixel defining layer 170 may include or be formed of an organic material such as polyimide or HMDSO.

The intermediate layer 220 of the organic light-emitting device OLED may include a relatively low molecular material or a polymer material. When a relatively low molecular material is included, the intermediate layer 220 may have a structure in which a hole injection layer ("HIL"), a hole transport layer ("HTL"), an organic emission layer ("EML"), an electron transport layer ("ETL"), an electron injection layer ("EIL") and the like are stacked in a single-layer or multi-layer structure, and may include various organic materials such as copper phthalocyanine (CuPc), N,N'-Di(naphthalene-1-yl)-N,N'-diphenyl-benzidine ("NB"), or tris-8-hydroxyquinoline aluminum (Alq3). In an embodiment of a method of manufacturing a display apparatus, these layers may be formed using a vacuum deposition method.

When the intermediate layer 220 includes a polymer material, the intermediate layer 220 may typically have a structure including a hole transport layer ("HTL") or an organic emission layer ("EML"). The hole transport layer ("HTL") may include poly(3,4-ethylenedioxythiophene) ("PEDOT"), and the emission layer may include a polymer material such as a poly-phenylenevinylene ("PPV")-based material or a polyfluorene-based material. In an embodiment of a method of manufacturing a display apparatus, the intermediate layer 220 may be formed using, for example, a screen printing method, an inkjet printing method or a laser induced thermal imaging ("LITI") method.

The intermediate layer 220 is not limited to the above, and may have various structures. The intermediate layer 220 may include a single layer commonly covering a plurality of pixel electrodes 210 or may collectively include individual layers patterned to respectively correspond to a plurality of pixel electrodes 210.

The opposite electrode 230 may be formed integrally within a plurality of organic light-emitting devices (OLEDs) and correspond to a plurality of pixel electrodes 210. That is, a single opposite electrode (layer) 230 may be common to each of a plurality of pixel electrodes 210.

When the pixel electrode 210 functions as an anode, the pixel electrode 210 may include, for example, indium tin oxide ("ITO"), indium zinc oxide ("IZO"), zinc oxide (ZnO), or indium oxide ($In_2O_3$) which have a relatively high work function. When a display apparatus is a front emission type (e.g., displaying an image at the pixel electrode 210 side of the display apparatus), the pixel electrode 210 may further include a reflective layer including Ag, Mg, Al, Pt, Pd, Au, Ni, Nd, Ir, Cr, Li, Yb or Ca or the like. The materials may be used alone or in combination. In addition, the pixel electrode 210 may have a single-layer or multi-layer structure including a metal and/or alloy described above. In some embodiments, the pixel electrode 210 may be a reflective electrode and include an ITO/Ag/ITO structure.

When the opposite electrode 230 functions as a cathode electrode, the opposite electrode 230 may include or be formed of a metal such as Ag, Mg, Al, Pt, Pd, Au, Ni, Nd, Ir, Cr, Li, or Ca. When a display apparatus is a front emission type, the opposite electrode 230 is light-transmissive. In some embodiments, the opposite electrode 230 may include ITO, IZO, ZTO, ZnO, or $In_2O_3$, which are transparent conductive metal oxides.

In another embodiment, the opposite electrode 230 may include or be formed of a thin film including at least one material selected from Li, Ca, LiF/Ca, LiF/Al, Al, Ag, Mg, and Yb. In an embodiment, for example, the opposite electrode 230 may have a single-layer structure or a stacked structure including Mg:Ag, Ag:Yb and/or Ag.

Referring back to FIGS. 3 through 9, the display apparatus according to one or more embodiment of the present disclosure includes the driving TFT T1, the first capacitor Cst, the first interlayer insulating layer 140 and the second capacitor Cpr.

The first capacitor Cst includes the first electrode C1, the pattern-dielectric layer 130 and the second electrode C2 that are sequentially stacked in a direction away from the substrate 110. The second capacitor Cpr includes the third electrode C3, the second interlayer insulating layer 150 and the fourth electrode C4 that are sequentially stacked in a direction away from the substrate 110. In addition, a lateral or side surface of the pattern-dielectric layer 130 is covered by the first interlayer insulating layer 140, such that the pattern-dielectric layer 130 is respectively disposed spaced apart from the contact plugs 31p, 33p and 34p in the fourth, fifth and sixth contact holes CNT4, CNT5, and CNT6 passing through the first interlayer insulating layer 140 and the second interlayer insulating layer 150.

According to the one or more embodiment, a permittivity of the pattern-dielectric layer 130 may be greater than that of the first interlayer insulating layer 140 and/or the second interlayer insulating layer 150. In an embodiment, for example, the pattern-dielectric layer 130 may include at least one of $ZrO_2$, $TiO_2$, $Ta_2O_5$, $Al_2O_3$, $SrTiO_3$, and $BaTiO_3$. The first interlayer insulating layer 140 and/or the second interlayer insulating layer 150 may include at least one of silicon oxide, silicon nitride and silicon oxynitride.

In some embodiments, the pattern-dielectric layer 130 may have a same planar shape as the overlying second electrode C2 disposed on the pattern-dielectric layer 130. In addition, a pattern-insulating layer 131 may be further disposed in a same level or single layer among layers disposed on the substrate 110 and formed of a same material as the pattern-dielectric layer 130. In an embodiment of manufacturing a display apparatus, the pattern-dielectric layer 130 and the pattern-insulating layer 131 may each be formed from a same single material layer to be disposed in a same single layer within the display apparatus. The pattern-insulating layer 131 may have a same planar shape as the overlying scan line 11, the compensation control line 12 and the first connection electrode 13. In an embodiment of manufacturing a display apparatus, the second electrode C2, the scan line 11, the compensation control line 12 and the first connection electrode 13 may be used as a metal mask to form the pattern-dielectric layer 130 and the pattern-insulating layer 131. In this case, lateral (side) surfaces of the second electrode C2 may be aligned or coplanar with lateral (side) surfaces of the pattern-dielectric layer 130, and a lateral (side) surface of each of the scan line 11, the compensation control line 12 and the first connection electrode 13 may be aligned or coplanar with lateral (side) surfaces of the pattern-insulating layer 131 disposed under the scan line 11, the compensation control line 12 and the first connection electrode 13.

According to one or more embodiment, as the pattern-dielectric layer 130 is disposed in selective areas, the pattern-dielectric layer 130 is disposed spaced apart from the fourth, fifth and sixth contact holes CNT4, CNT5 and CNT6 passing through the first interlayer insulating layer 140 and the second interlayer insulating layer 150 and from the contact plugs 33p and 34p in the sixth and seventh contact holes CNT6 and CNT7.

In a conventional structure of a display apparatus, the pattern-dielectric layer 130 is disposed over the entire surface of the substrate 110. When forming contact holes of such conventional display apparatus, the first interlayer insulating layer 140, the second interlayer insulating layer 150 and the pattern-dielectric layer 130 are etched. In this case, since the pattern-dielectric layer 130 disposed over the entire surface of the substrate 110 and which typically has a relatively high permittivity, has a greater density than that of the first interlayer insulating layer 140 and the second interlayer insulating layer 150 which have a relatively low permittivity, there is a disadvantage in that an etching process needs to be performed in multiple processes or operations, or over-etching or under-etching results when the etching process is performed in one process or operation.

In contrast, according to one or more embodiment, the pattern-dielectric layer 130 is patterned before forming contact holes in the first interlayer insulating layer 140 and the second interlayer insulating layer 150 such that the pattern-dielectric layer 130 is disposed apart from positions at which the fourth, fifth and sixth contact holes CNT4, CNT5, and CNT6 passing through the first interlayer insulating layer 140 and the second interlayer insulating layer 150 are to be formed, so that the pattern-dielectric layer 130 is not disposed at locations where the fourth, fifth and sixth contact holes CNT4, CNT5 and CNT6 are formed. Accordingly, the fourth, fifth and sixth contact holes CNT4, CNT5 and CNT6 without defects may be formed.

According to one or more embodiment, the pattern-dielectric layer 130 includes a material having a relatively high dielectric constant, and thus, the first capacitor Cst may have a relatively high electrostatic capacitance even in a small planar area. In addition, as the pattern-dielectric layer 130 is disposed only in selective areas, the effect by parasitic capacitance may be minimized.

Figure 10:
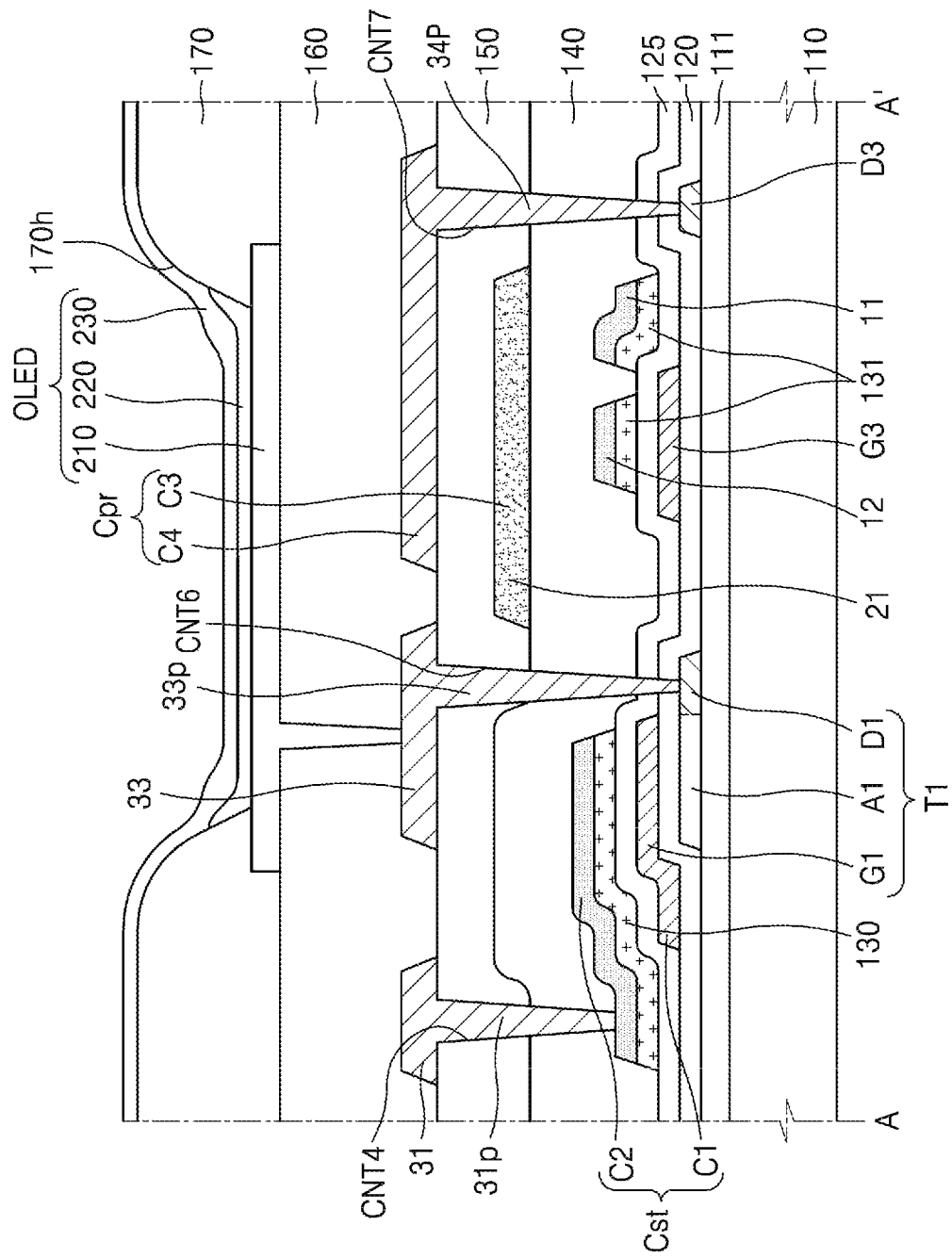
FIG. 10 is a cross-sectional view illustrating another embodiment of a portion of a display apparatus taken along line A-A' of FIG. 3 according to the invention.

FIG. 10 is a cross-sectional view illustrating another embodiment of a display apparatus taken along line A-A' of FIG. 3 according to the invention. In FIG. 10, like reference numerals as those in FIG. 9 denote like elements, and repeated description thereof will be omitted.

Referring to FIG. 10, the display apparatus according to the present embodiment includes the driving TFT T1, the first capacitor Cst, the first interlayer insulating layer 140 and the second capacitor Cpr.

The first capacitor Cst includes the first electrode C1, the pattern-dielectric layer 130 and the second electrode C2 that are sequentially stacked, and the second capacitor Cpr includes the third electrode C3, the second interlayer insulating layer 150 and the fourth electrode C4 that are sequentially stacked. In addition, lateral surfaces of the pattern-dielectric layer 130 are covered by the first interlayer insulating layer 140, and the pattern-dielectric layer 130 is disposed spaced apart from the contact plugs 31p, 33p and 34p respectively in the fourth, fifth and sixth contact holes CNT4, CNT5, and CNT6 passing through the first interlayer insulating layer 140 and the second interlayer insulating layer 150.

In addition, the display apparatus according to the present embodiment may further include a lower insulating layer 125 disposed under the pattern-dielectric layer 130 and the pattern-insulating layer 131 and covering the conductive layer including the first electrode C1 and the gate electrodes G1, G2 and G3. The lower insulating layer 125 may extend to be commonly disposed relative first capacitor Cst, the scan line 11 and the compensation control line 12.

The lower insulating layer 125 may include an inorganic material including an oxide or a nitride. In an embodiment, for example, the lower insulating layer 125 may include silicon oxide ($SiO_2$), silicon nitride (SiNx), or silicon oxynitride (SiON). A permittivity of the lower insulating layer 125 may be lower than that of the pattern-dielectric layer 130.

In some embodiments, an etching rate of a material for forming the lower insulating layer 125 may be different from that of the pattern-dielectric layer 130. Accordingly, in an embodiment of a method of manufacturing a display apparatus, when etching a material layer for forming the pattern-dielectric layer 130 and the pattern-insulating layer 131, the lower insulating layer 125 disposed thereunder may function as an etch stop layer. That is, the lower insulating layer 125 may be included to protect the layers disposed therebelow.

Figure 11:
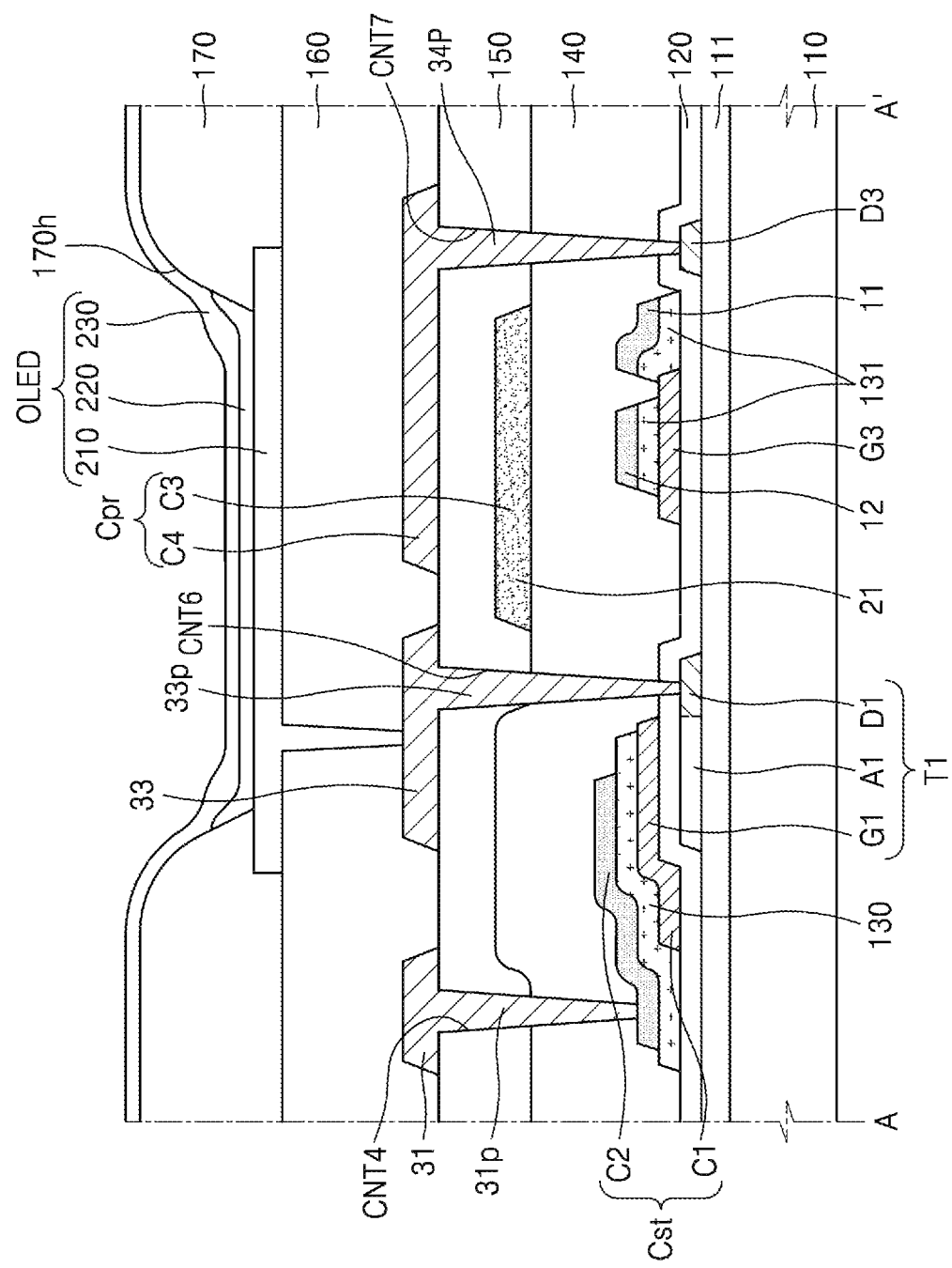
FIG. 11 is a cross-sectional view illustrating still another embodiment of a portion of a display apparatus taken along line A-A' of FIG. 3 according to the invention.

FIG. 11 is a cross-sectional view illustrating another embodiment of a display apparatus according to the invention. In FIG. 11, like reference numerals as those in FIG. 9 denote like elements, and repeated description thereof will be omitted.

Referring to FIG. 11, the display apparatus according to the present embodiment includes the driving TFT T1, the first capacitor Cst, the first interlayer insulating layer 140 and the second capacitor Cpr.

The first capacitor Cst includes the first electrode C1, the pattern-dielectric layer 130 and the second electrode C2 that are sequentially stacked, and the second capacitor Cpr includes the third electrode C3, the second interlayer insulating layer 150 and the fourth electrode C4 that are sequentially stacked. In addition, lateral surfaces of the pattern-dielectric layer 130 are covered by the first interlayer insulating layer 140, and the pattern-dielectric layer 130 is disposed apart from the contact plugs 31p, 33p and 34p respectively in the contact holes CNT4, CNT5 and CNT6 passing through the first interlayer insulating layer 140 and the second interlayer insulating layer 150.

In addition, according to the display apparatus of the present embodiment, both of opposing ends of the second electrode C2 of the first capacitor Cst may be disposed further toward the inside than corresponding ends of the pattern-dielectric layer 130. In other words, the pattern-dielectric layer 130 extends further than the second electrode C2 such that upper and side surfaces of the pattern-dielectric layer 130 is exposed from the second electrode C2. That is, lateral surfaces of the second electrode C2 and lateral surfaces of the pattern-dielectric layer 130 may not meet each other to not be aligned with each other, and the second electrode C2 may have a smaller planar area than that of the pattern-dielectric layer 130 owing from lateral surfaces thereof being spaced apart from those of the second electrode C2. According to this structure, concentration of an electrical field between the first electrode C1 and the second electrode C2 at respective lateral surfaces thereof may be reduced or effectively prevented.

In an embodiment of manufacturing a display apparatus, the second electrode C2 and the pattern-dielectric layer 130 having the above-described structure may be formed using a single photoresist pattern by using a halftone mask. That is, the second electrode C2 and the pattern-dielectric layer 130 may be formed by forming a photoresist pattern having a stepped structure by using a halftone mask, and then etching material layers for forming the second electrode C2 and the pattern-dielectric layer 130 by using the photoresist pattern.

FIGS. 12A through 12F are cross-sectional views sequentially illustrating embodiments operations within a method of manufacturing the display apparatus of FIG. 9. The views are taken along line A-A' of FIG. 3. While regions of the individual layers illustrated in FIGS. 4-8 are discussed relating to the structures in FIG. 9, other regions of the individual layers illustrated in FIGS. 4-8 which are not explicitly shown in FIG. 9 may also be formed in the various operations discussed below.

Figure 12A:
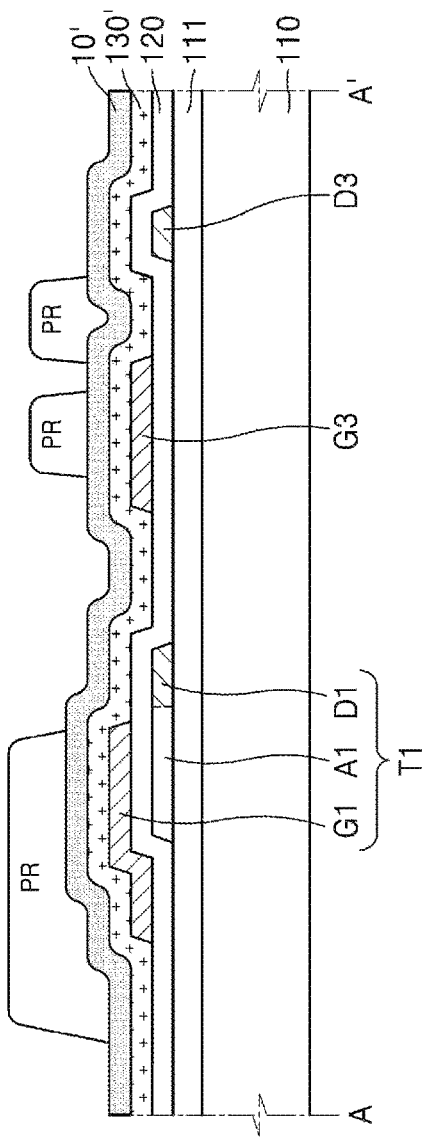

Referring to FIG. 12A, a buffer layer 111, a driving semiconductor layer A1 and a compensation semiconductor layer A3, a driving gate electrode G1 and a compensation gate electrode G3, a dielectric material layer 130', and a metal material layer 10' are formed on the substrate 110.

The buffer layer 111 may have a single-layer or multi-layer structure including an oxide layer such as silicon oxide (SiOx) and/or a nitride layer such as silicon nitride (SiNx). The buffer layer 111 may be formed using various deposition methods such as a plasma enhanced chemical vapor deposition ("PECVD") method, an atmospheric pressure CVD ("APCVD") method, or a low pressure CVD ("LPCVD") method.

The semiconductor layers A1 and A3 are formed on the buffer layer 111. The semiconductor layers A1 and A3 may be formed of an inorganic semiconductor material such as amorphous silicon or polysilicon, or an organic semiconductor, or an oxide semiconductor. The semiconductor layers A1 and A3 may be formed using various deposition methods such as a PECVD method, an APCVD method, or a LPCVD method. After forming a semiconductor material layer on an entirety of the buffer layer 111, the semiconductor material layer may be patterned to form semiconductor layers A1 and A3, for example, by etching the semiconductor material layer. A crystallization operation may be additionally performed to the semiconductor layers A1 and A3, before or after the semiconductor layer is patterned.

A gate insulating layer 120 covering the semiconductor layers A1 and A3 is formed on the buffer layer 111. The gate insulating layer 120 may be formed on the buffer layer 111 substantially uniformly according to planar and cross-sectional profiles of the semiconductor layers A1 and A3. The gate insulating layer 120 may be formed using various deposition methods such as a PECVD method, an APCVD method or a LPCVD method.

The gate electrode G1 and G3 are formed on the gate insulating layer 120. The gate electrodes G1 and G3 may include molybdenum (Mo), aluminum (Al), copper (Cu), or titanium (Ti) and have a single-layer or multi-layer structure. After an electrode material layer is formed overall on an entirety of the gate insulating layer 120, the electrode material layer may be patterned to form the gate electrodes G1 and G3, for example, by etching the electrode material layer. When the semiconductor layers A1 and A3 are formed of silicon, a doping operation in which an impurity is injected to the semiconductor layers A1 and A3 by using the gate electrodes G1 and G3 as a doping mask may be additionally performed.

A dielectric material layer 130' and a metal material layer 10' are sequentially formed on the entire surface of the substrate 110 to cover the gate electrodes G1 and G3.

The dielectric material layer 130' may include a material having a relatively high dielectric constant k. In an embodiment, for example, the dielectric layer 130' may include a material having a dielectric constant k of 10 or greater. In an embodiment, for example, a material having a dielectric constant k between about 10 and about 30 may be used as the dielectric material layer 130. In some embodiments, the dielectric layer 130' may include at least one of zirconium oxide ($ZrO_2$), titanium oxide ($TiO_2$), tantalum oxide ($Ta_2O_5$), aluminum oxide ($Al_2O_3$), $SrTiO_3$ and $BaTiO_3$.

The dielectric layer 130' may be formed using various deposition methods such as an atomic layer deposition ("ALD") method, a chemical vapor deposition ("CVD") method, a PECVD method, an APCVD method or a LPCVD method.

The metal material layer 10' is formed on the dielectric layer 130', and may include molybdenum (Mo), aluminum (Al), copper (Cu) or titanium (Ti) and have a single-layer or multi-layer structure. The metal material layer 10' may be formed using a deposition method such as a CVD method, a PECVD method, a LPCVD method, a physical vapor deposition ("PVD") method, a sputtering method or an ALD method.

A mask operation is performed to form a photoresist pattern PR at areas where the second electrode C2, the scan line 11 and the compensation control line 12 are to be formed.

Figure 12B:
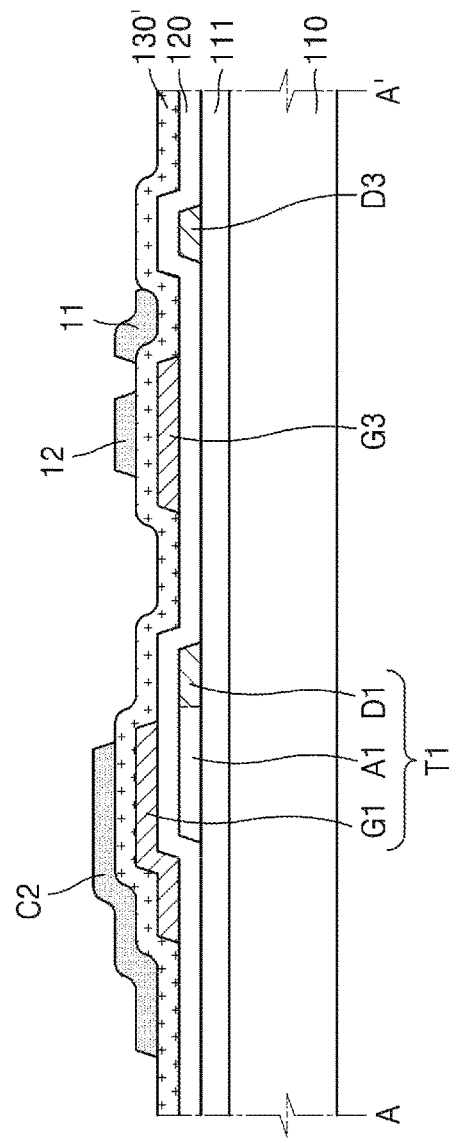

Referring to FIG. 12B, the metal material layer 10' is etched by using the photoresist pattern PR as a mask layer to form each of the second electrode C2, the scan line 11 and the compensation control line 12 from the single metal material layer 10'. The forming the second electrode C2, the scan line 11 and the compensation control line 12 exposes portions of the dielectric material layer 130'. The photoresist pattern PR may be removed from the stacked structure on the substrate 110, without being limited thereto.

Referring to FIG. 12C, the dielectric material layer 130' may be etched by using the second electrode C2, the scan line 11 and the compensation control line 12 as a mask layer, to form the pattern-dielectric layer 130 and the pattern-insulating layer 131. As etching conditions of the metal material layer 10' and etching conditions of the dielectric material layer 130' differ from each other, a speed or ratio at which the metal material layer 10' for forming the second electrode C2, the scan line 11 and the compensation control line 12 is etched relative to the speed or ratio at which the dielectric material layer 130' is etched may be very small. The forming the pattern-dielectric layer 130 and the pattern-insulating layer 131 exposes portions of layers thereunder. Side surfaces of the pattern-dielectric layer 130 and the pattern-insulating layer 131 are also exposed from the second electrode C2, the scan line 11 and the compensation control line 12 thereover.

While FIG. 12C illustrates etching of the dielectric material layer 130' by using the second electrode C2, the scan line 11 and the compensation control line 12 as a mask layer, the present disclosure is not limited thereto. In an embodiment, for example, the dielectric material layer 130' may be etched by using the photoresist pattern PR that is used to etch the metal material layer 10'. In this case, the photoresist pattern PR may be formed to be relatively thick along a thickness direction, so as to be used in etching both the metal material layer 10' and the dielectric material layer 130' to form the various elements therefrom. Since a pattern pitch decreases as the resolution increases, there is a limitation in forming a relatively fine pattern from material layers by using a relatively large thickness of the photoresist pattern PR as a mask. Accordingly, in one or more embodiment of the method of manufacturing a display apparatus, relatively fine patterns via which a high resolution may be provided may be formed based on the etching conditions in which the second electrode C2, the scan line 11 and the compensation control line 12 are used as a mask layer.

Referring to FIG. 12D, a first interlayer insulating layer 140 is formed to cover the entire surface of the substrate 110, and then a third electrode C3 and a second interlayer insulating layer 150 are sequentially formed thereon.

The first interlayer insulating layer 140 and/or the second interlayer insulating layer 150 may be formed of an inorganic material such as silicon oxide (SiOx), silicon nitride (SiNx) or silicon oxynitride (SiON). The first interlayer insulating layer 140 and/or the second interlayer insulating layer 150 may have a lower permittivity than that of the pattern-dielectric layer 130. In an embodiment, the first interlayer insulating layer 140 and/or the second interlayer insulating layer 150 may include a material having a relatively low dielectric constant of about 2 to about 8.

The third electrode C3 may be formed on the first interlayer insulating layer 140. The third electrode C3 may include a conductive material including, for example, molybdenum (Mo), aluminum (Al), copper (Cu), or titanium (Ti), and may be formed in a single-layer or multi-layer structure including the above material. In an embodiment, for example, the third electrode C3 may have a multi-layer structure of Ti/Al/Ti. After an electrode material layer for forming the third electrode C3 is formed on the first interlayer insulating layer 140 by using various deposition methods such as CVD or sputtering, such electrode material layer may be patterned to form the third electrode C3, such as by an etching operation.

The second interlayer insulating layer 150 is formed to cover the third electrode C3.

The first interlayer insulating layer 140 and/or the second interlayer insulating layer 150 may be formed using various depositions methods such as a PECVD method, an APCVD method or a LPCVD method.

Figure 12E:
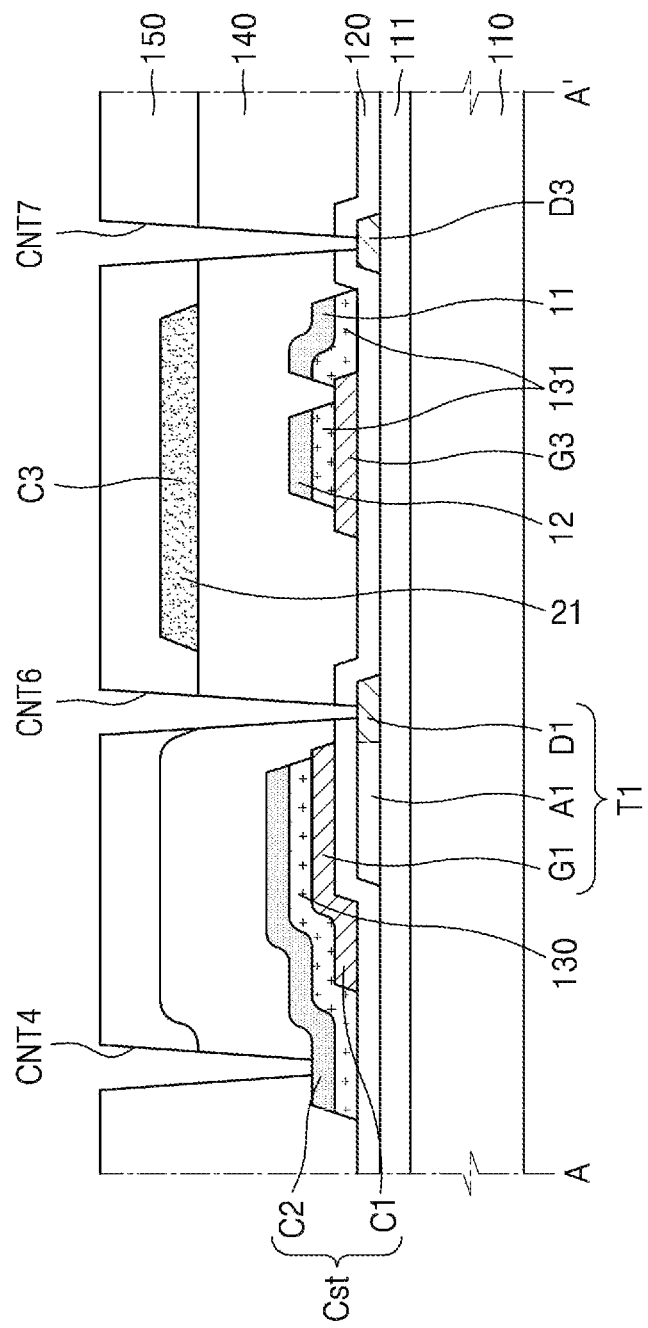

Referring to FIG. 12E, fourth, sixth and seventh contact holes CNT4, CNT6 and CNT7 each passing through the second interlayer insulating layer 150 and the first interlayer insulating layer 140 are formed. The fourth contact hole CNT4 may be formed to expose the second electrode C2 of the first capacitor Cst. The sixth contact hole CNT6 and the seventh contact hole CNT7 may further pass through the gate insulating layer 120 to expose portions of the semiconductor layers A1 and A3 at the driving and compensation TFTs T1 and T3.

The fourth, sixth and seventh contact holes CNT4, CNT6 and CNT7 may be formed by dry etching, wet etching or a combination of these methods.

The fourth, sixth and seventh contact holes CNT4, CNT6 and CNT7 are disposed spaced apart from the pattern-dielectric layer 130 and the pattern-insulating layer 131. That is, when forming the fourth, sixth and seventh contact holes CNT4, CNT6 and CNT7, the pattern-dielectric layer 130 and/or the pattern-insulating layer 131 are not etched. The various contact holes may be spaced from the dielectric material of the pattern-dielectric layer 130 and the pattern-insulating layer 131 in both a thickness direction (e.g., vertical in FIG. 12E) and horizontal (e.g., horizontal in FIG. 12E.)

In a conventional method of manufacturing a display apparatus, when the pattern-dielectric layer 130 is present at an area where the fourth, sixth and seventh contact holes CNT4, CNT6, and CNT7 are to be formed, as etching conditions of the pattern-dielectric layer 130 are different from those of the first interlayer insulating layer 140 and the second interlayer insulating layer 150, an etching operation needs to be performed in two stages, but this may undesirably extend the manufacturing process time.

According to one or more present embodiment, materials having similar etching conditions are stacked in the area where the fourth, sixth and seventh contact holes CNT4, CNT6 CNT7 are to be formed, and thus, the fourth, sixth, and seventh contact holes CNT4, CNT6 CNT7 may be formed easily, such as with a same process and the possibility of defects may be relatively low.

Figure 12F:
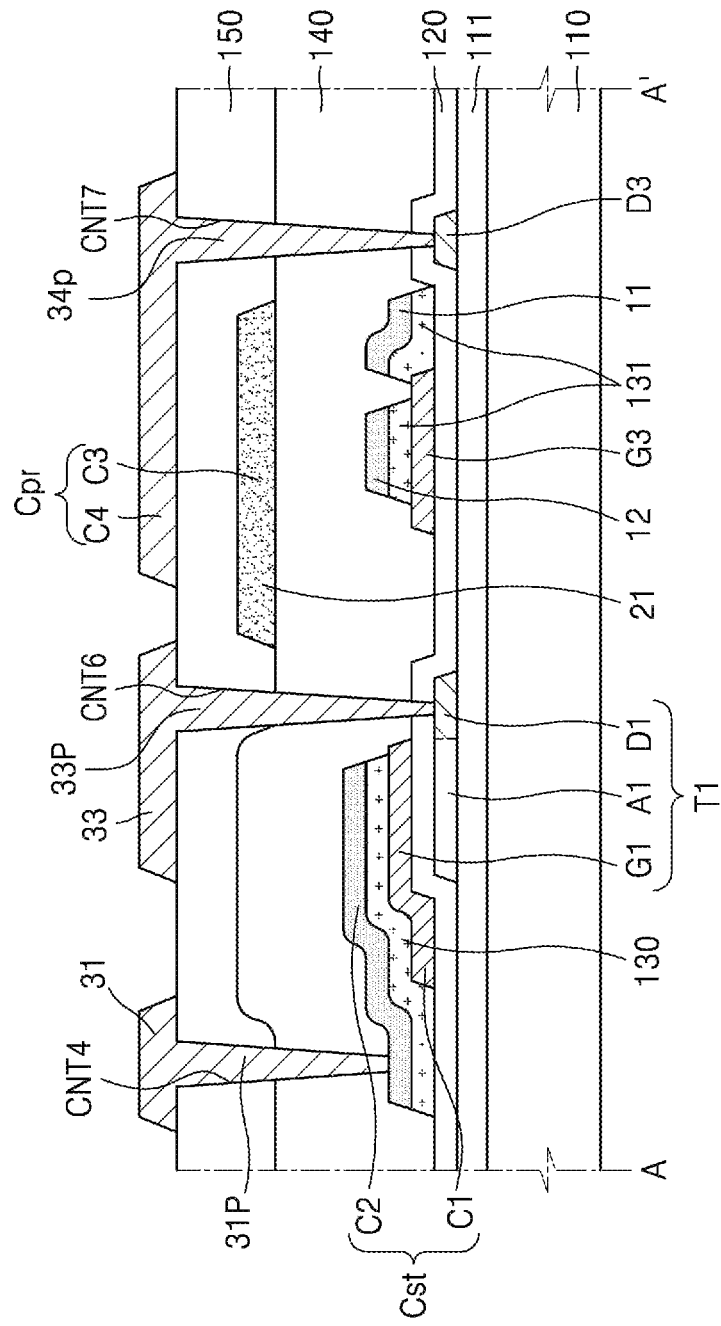

Referring to FIG. 12F, the first connection electrode 31, the second connection electrode 33 and the fourth electrode C4 and contact plugs 31p, 33p and 34p which respectively extend therefrom are formed to fill the fourth, sixth and seventh contact holes CNT4, CNT6, CNT7 are formed on the second interlayer insulating layer 150. Extended portions of the first connection electrode 31, the second connection electrode 33 and the fourth electrode C4 may be considered as respectively defining the contact plugs 31p, 33p and 34p.

The contact plugs 31p, 33p and 34p filling the fourth, sixth and seventh contact holes CNT4, CNT6 and CNT7 may include a conductive material including, for example, molybdenum (Mo), aluminum (Al), copper (Cu), or titanium (Ti), and may be formed in a single-layer or multi-layer structure including the above material. After a conductive material layer is formed overall on the second interlayer insulating layer 150, such conductive layer for forming the contact plugs 31p, 33p, and 34p filling the fourth, sixth and seventh contact holes CNT4, CNT6 and CNT7 may be patterned, such as by etching.

As described above, as the first capacitor Cst of the display apparatus of one or more embodiment of the present disclosure includes a pattern-dielectric layer including a material of a relatively high dielectric constant, relatively high electrostatic capacitance may be provided even in a small planar area. As the pattern-dielectric layer is included only in selective areas instead of being commonly disposed across layers within the stacked structure on the substrate, the effect of parasitic capacitance may be minimized. The pattern-dielectric layer is disposed spaced apart from the contact holes passing through the first interlayer insulating layer, and thus, the contact holes may be formed easily.

However, the scope of the present disclosure is not limited by the above-described effects.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate; and
a plurality of pixels on the substrate, the plurality of pixels displaying an image, each of the plurality of pixels comprising:
a light-emitting device with which light is emitted to display the image;
a first thin film transistor on the substrate, the first thin film transistor including a driving semiconductor layer and a driving gate electrode;
a second thin film transistor on the substrate, the second thin film transistor including a second semiconductor layer;
a first capacitor in which a first electrode including the driving gate electrode of the first thin film transistor, a first dielectric pattern and a second electrode are sequentially stacked from the substrate;
a first interlayer insulating layer which covers lateral surfaces of the first dielectric pattern within the first capacitor;
a second capacitor comprising a third electrode and a fourth electrode;
a second interlayer insulating layer between the third electrode and the fourth electrode;
a first line disposed on the second interlayer insulating layer, the first line connected to the driving semiconductor layer of the first thin film transistor through a first contact hole through the first interlayer insulating layer and the second interlayer insulating layer,
wherein
the first contact hole is spaced apart from the first dielectric pattern, and
the fourth electrode is disposed on a same layer as the first line and connected to the second semiconductor layer.

2. The display apparatus of claim 1, wherein a permittivity of the first dielectric pattern is greater than a permittivity of the first interlayer insulating layer.

3. The display apparatus of claim 1, further comprising:
a scan line through which a control signal is transmitted to control transmission of a data signal to the first thin film transistor, disposed in and formed from a same single material layer as the second electrode of the first capacitor, and
a second dielectric pattern disposed between the substrate and the scan line, disposed in and formed from a same single material layer as the first dielectric pattern of the first capacitor.

4. The display apparatus of claim 1, wherein
the first dielectric pattern comprises at least one of $ZrO_2$, $TiO_2$, $Ta_2O_5$, $Al_2O_3$, $SrTiO_3$ and $BaTiO_3$, and
the first interlayer insulating layer comprises at least one of silicon oxide, silicon nitride and silicon oxynitride.

5. The display apparatus of claim 1, wherein within the first capacitor, lateral surfaces of the first dielectric pattern are aligned with lateral surfaces of the second electrode.

6. The display apparatus of claim 1, further comprising a lower insulating layer between the first electrode and the first dielectric pattern of the first capacitor.

7. The display apparatus of claim 1, wherein within the first capacitor, the first dielectric pattern extends further than ends of the second electrode to expose opposing ends of the first dielectric pattern from the second electrode.

8. The display apparatus of claim 1, wherein the first thin film transistor including the driving semiconductor layer and the driving gate electrode overlaps the first capacitor including the first electrode, the first dielectric pattern and the second electrode.

9. The display apparatus of claim 1, wherein
the light-emitting device comprises:
a pixel electrode,
an opposite electrode facing the pixel electrode, and
an intermediate layer between the pixel electrode and the opposite electrode.

10. The display apparatus of claim 1, wherein for the first thin film transistor and the first capacitor, a shape of the first dielectric pattern corresponds to a shape of the second electrode.

11. The display apparatus of claim 1, wherein each of the plurality of pixels further comprising:
a second line disposed on a same layer as the first line, the second line connected to the second electrode of the first capacitor through a second contact hole through the first interlayer insulating layer and the second interlayer insulating layer, and
a connection electrode connecting the light-emitting device to the driving semiconductor layer of the first thin film transistor,
wherein the first line, the second line and the connection electrode are disposed on a same layer.

12. The display apparatus of claim 1, wherein the light-emitting device is an organic light-emitting device.

* * * * *